(12) United States Patent
Yamabuchi et al.

(10) Patent No.: US 10,808,314 B2
(45) Date of Patent: Oct. 20, 2020

(54) VAPOR DEPOSITION MASK AND METHOD FOR MANUFACTURING VAPOR DEPOSITION MASK

(71) Applicant: Sharp Kabushiki Kaisha, Sakai, Osaka (JP)

(72) Inventors: Koji Yamabuchi, Sakai (JP); Shinsaku Nakajima, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/472,919

(22) PCT Filed: Sep. 28, 2017

(86) PCT No.: PCT/JP2017/035194
§ 371 (c)(1),
(2) Date: Jun. 24, 2019

(87) PCT Pub. No.: WO2019/064419
PCT Pub. Date: Apr. 4, 2019

(65) Prior Publication Data
US 2019/0368028 A1    Dec. 5, 2019

(51) Int. Cl.
*C23C 14/24*    (2006.01)
*C23C 14/04*    (2006.01)
*H01L 21/033*   (2006.01)
*H01L 51/00*    (2006.01)

(52) U.S. Cl.
CPC ............ *C23C 14/24* (2013.01); *C23C 14/04* (2013.01); *H01L 21/033* (2013.01); *H01L 51/0001* (2013.01)

(58) Field of Classification Search
None
See application file for complete search history.

(56) References Cited

U.S. PATENT DOCUMENTS

| 2006/0091793 A1* | 5/2006 | Baude ............... H01L 27/3244 313/506 |
| 2007/0017895 A1 | 1/2007 | Yotsuya et al. |
| 2012/0156812 A1 | 6/2012 | Ko et al. |
| 2017/0130320 A1 | 5/2017 | Kobayashi et al. |

FOREIGN PATENT DOCUMENTS

| JP | 2007-023358 A | 2/2007 |
| JP | 2007-039777 A | 2/2007 |
| JP | 2012-132096 A | 7/2012 |
| JP | 2016-009673 A | 1/2016 |

OTHER PUBLICATIONS

Official Communication issued in International Patent Application No. PCT/JP2017/035194, dated Jan. 9, 2018.

* cited by examiner

*Primary Examiner* — Long Pham
(74) *Attorney, Agent, or Firm* — Keating & Bennett, LLP

(57) ABSTRACT

A valid portion formed on a mask sheet is provided to extend across a plurality of active regions on a vapor target substrate. The valid portion includes a first region and a second region. The first region is provided in a shape corresponding to a shape of each of the active regions for each of the active regions. The second region is located outside the first region, and is provided with a covering portion configured to cover a plurality of vapor deposition holes.

12 Claims, 20 Drawing Sheets

ENLARGED VIEW OF SECOND SURFACE 15c OF VALID PORTION YA

LOWER FACE ETCHING

FIG. 9C   CROSS SECTION B-B

FIG. 9D   CROSS SECTION C-C

VAPOR DEPOSITION MASK AND METHOD FOR MANUFACTURING VAPOR DEPOSITION MASK

TECHNICAL FIELD

The disclosure relates to a vapor deposition mask and a method for manufacturing the vapor deposition mask.

BACKGROUND ART

As described in PTL 1, a vapor deposition mask is used in the case of patterning and forming a light-emitting layer on each pixel in an organic EL display device.

As illustrated in FIG. 18A, a plurality of covering sheets 112 and a plurality of hauling sheets 113 each have a sheet shape and are attached to a mask frame 111 having a frame shape and including frame openings 111a to intersect each other at a right angle in a lattice pattern.

When the plurality of covering sheets 112 and the plurality of hauling sheets 113 are attached to the mask frame 111, both end portions of these sheets and portions near both the end portions of these sheets are welded to the mask frame 111 while both the end portions of these sheets are stretched (pulled) outwards.

Accordingly, the plurality of covering sheets 112 are attached to the mask frame 111 to be parallel to a short-hand direction (left-right direction on the paper surface) perpendicular to a longitudinal direction (up-down direction on the paper surface) of the mask frame 111. In addition, the plurality of hauling sheets 113 are attached to the mask frame 111 to be parallel to the longitudinal direction of the mask frame 111.

Next, an alignment sheet 114 including an alignment mark formed is attached to the mask frame 111 along the shorter side of the frame opening 111a to make the alignment mark located at a predetermined position.

Then, both the end portions of the plurality of mask sheets 115 in a strip form and portions near both the end portions of the plurality of mask sheets 115 are welded to the mask frame 111 by using the alignment mark as the reference while both the end portions of the plurality of mask sheets 115 are stretched (pulled) outwards.

The mask sheets 115 each include a plurality of valid portions 115a formed. The valid portions 115a are regions in which a plurality of vapor deposition holes for vapor-depositing a vapor-deposition layer on each pixel of the vapor target substrate are formed to be arranged.

In the example in FIG. 18, the valid portions 115a each have a shape corresponding to a shape of an active region of the vapor target substrate.

As illustrated in FIG. 18B, the plurality of mask sheets 115 are stretched and welded to cause all the openings defined by the plurality of covering sheets 112 and the plurality of hauling sheets 113 to be present in the valid portion 115a. Then, an unnecessary portion of each of the plurality of mask sheets 115 located outside of the welded portion is cut off. Accordingly, the vapor deposition mask 110 is complete.

At the time of performing vapor deposition by using the vapor deposition mask 110, vapor deposition particles vaporized or sublimated from a vapor deposition source pass through the vapor deposition holes of the valid portions 115a, and are attached on pixels of the vapor target substrate. The vapor deposition particles attached on the pixels serve as a light-emitting layer. Hence, the valid portion 115a has a shape corresponding to a shape of the active region of the vapor target substrate, and patterns are formed in a region having area smaller than area of each of the openings defined by the plurality of covering sheets 112 and the plurality of hauling sheets 113. Then, a position of the light-emitting layer vapor-deposited on the vapor target substrate is determined by the position of the opening pattern provided in each vapor deposition hole of the vapor deposition mask, and an external shape of the active region of the vapor target substrate on which the light-emitting layer is vapor-deposited is determined by an external shape of the valid portion 115a.

In particular, since the plurality of vapor deposition holes corresponding to the pixels are formed in the mask sheet 115 including the valid portions 115a formed as described above, the mask sheet 115 needs to be attached to the mask frame 111 with high positional accuracy.

According to the mask sheets 115, since the valid portion 115a has a rectangular shape, even when outward force is applied to the end portions of the mask sheets 115 at the time of attachment of the mask sheets 115 to the mask frame 111, stress applied on a periphery of the valid portion 115a is easily made uniform, and the mask sheets 115 can be attached to the mask frame 111 with a relatively high positional accuracy.

CITATION LIST

Patent Literature

PTL 1: JP 2012-132096 A

SUMMARY

Technical Problem

In the related art, an external shape of a display region of an organic EL display device has a square or rectangular shape commonly applied to a smartphone or the like, and can be easily manufactured.

In recent years, a flexible (bendable) organic EL display device has been developed by using a film, rather than glass, as a support body. In particular, in the case of the flexible organic EL display device described above, the support body is formed of a film, rather than glass, and hence, the support body is easy to machine and can be cut into various shapes.

Then, for example, to differentiate smartphones or other electronic devices in terms of design, there has been a demand for forming the external shape of the display region into an irregular shape different from a square or rectangular shape, such as a shape in which a rounded shape (round shape) is provided to each corner, and a shape in which a notch (recess) for disposing a camera and speaker is provided.

In a case where a light-emitting layer is present in such a cut portion having an irregular shape, a portion of the light-emitting layer is not sealed at the sealing step subsequently performed and becomes exposed, and hence, reliability cannot be secured. Hence, at the vapor deposition step for vapor-depositing the light-emitting layer, masking needs to be performed to prevent the light-emitting layer from being vapor-deposited in the cut portion having an irregular shape.

In addition, in a case where an external shape of a valid portion 115a of a mask sheet 115 illustrated in FIG. 18 is set to correspond to the shape of the cut portion having an irregular shape of the active region and is set to be the same shape as the shape of the cut portion having an irregular shape, for example, as illustrated in FIGS. 19 and 18 described below, positional accuracy of a vapor deposition hole deteriorates when the mask sheet 115 is attached to the mask frame 111. Further, in recent years, there has been a demand for pixels having higher resolution, and hence, there has been an increase in demand for preventing a decrease in positional accuracy of a vapor deposition hole, and for attaching the mask sheet 115 to the mask frame 111.

The disclosure has been made in view of the above-described problems of the related art, and an object of the disclosure is to provide a vapor deposition mask that can be used for pattern formation of a vapor-deposition layer with high accuracy even when an active region has an irregular shape different from a square or rectangular shape.

Solution to Problem

To solve the problems described above, a vapor deposition mask according to an aspect of the disclosure provides a vapor deposition mask configured to be used to vapor-deposit a vapor-deposition layer on each of pixels of a vapor target substrate provided with a plurality of active regions on which the pixels contributing to displaying are arranged, the vapor deposition mask including: a mask sheet provided with a valid portion extending across the plurality of active regions and including a plurality of vapor deposition holes are formed to be arranged, wherein the valid portion includes a first region and a second region, the first region has a shape corresponding to a shape of each of the active regions, and the second region is provided with a covering portion configured to define a shape of the first region and cover a portion of a vapor deposition hole of the plurality of vapor deposition holes.

In order to solve the problems described above, a method for manufacturing a vapor deposition mask according to an aspect of the disclosure provides a method for manufacturing a vapor deposition mask used to vapor-deposit a vapor-deposition layer on each of pixels of a vapor target substrate provided with a plurality of active regions on which the pixels contributing to displaying are arranged, the method including: a vapor-deposition-hole forming step for forming a plurality of vapor deposition holes in a mask sheet to provide a valid portion extending across the plurality of the active regions; and a covering-portion forming step for forming, outside of a shape of the valid portion corresponding to each of the active regions in the valid portion, a covering portion configured to cover a portion of a vapor deposition hole of the plurality of vapor deposition holes, to provide, for each of the active regions, a first region having a shape corresponding to a shape of each of the active regions and provide a second region provided with the covering portion.

Advantageous Effects of Disclosure

According to an aspect of the disclosure, an effect in which pattern formation of a vapor-deposition layer can be performed with high accuracy even when an active region has an irregular shape different from a square or rectangular shape is exhibited.

BRIEF DESCRIPTION OF DRAWINGS

FIGS. 9A to 9D are views each illustrating a configuration of a mask sheet according to the first embodiment.

FIG. 17A is a view illustrating a state where a mask sheet is attached to a mask frame, and FIG. 17B is a plan view illustrating the vapor deposition mask made.

DESCRIPTION OF EMBODIMENTS

First Embodiment

Configuration of Electronic Device 30

Figure 1A:
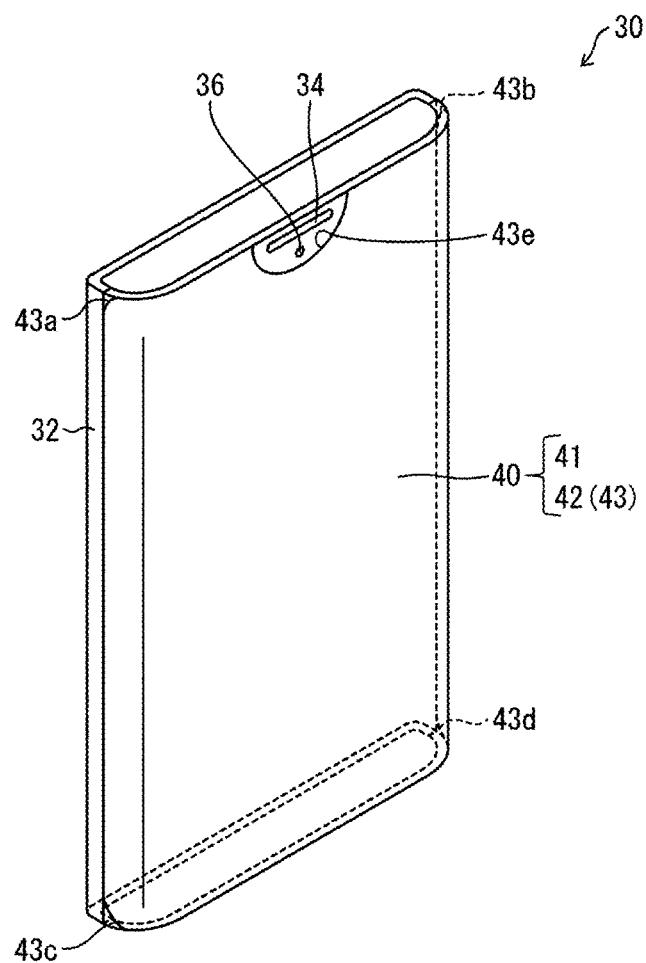
FIGS. 1A and 1B are views each illustrating a configuration of an organic EL display device according to a first embodiment.
Figure 1B:
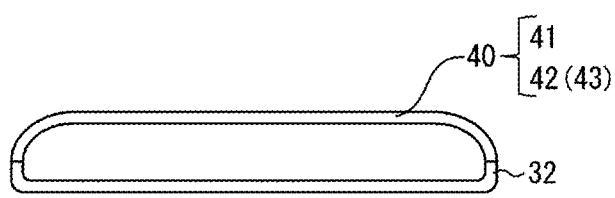

FIG. 1A is a perspective view illustrating an external appearance of an electronic device 30 in which an organic EL display device according to a first embodiment of the disclosure is used, and FIG. 1B is a cross-sectional view of FIG. 1A. An example of the electronic device 30 can include a smartphone. However, the electronic device 30 is not limited to a smartphone, and may be any electronic device including an organic EL display panel (display panel having an irregular shape) 42 incorporated, and examples of the electronic device 30 include any other mobile information terminal such as a mobile phone terminal or a tablet, a television receiver, and a personal computer.

The electronic device 30 includes a housing 32. Then, the electronic device 30 includes a touch panel 40, a speaker 34, a camera 36, and a not-illustrated microphone, each of which is provided in the housing 32. In addition, the electronic device 30 may include various types of buttons such as a power button for switching between power-on and power-off.

The touch panel 40 includes a touch sensor 41 and an organic EL display panel 42. The organic EL display panel 42 includes a display region 43 having an irregular shape and configured to display various images. The organic EL display panel 42 includes the display region 43 and a frame region surrounding the periphery of the display region 43. Various parts are attached to the organic EL display panel 42 to constitute an organic EL display device (display device).

The touch sensor 41 is provided in the organic EL display panel 42. The touch sensor 41 is an input device configured to detect an input operation performed by contact or approaching of a finger, a stylus pen, or the like to receive an input of a coordinate position on the organic EL display panel 42 from a user. The touch sensor 41 may be formed integrally with the organic EL display panel 42, or may be formed as a separate configuration from the organic EL display panel 42. The touch sensor 41 may be of a type capable of receiving an input operation from a user such as a capacitive type and an infrared type.

An external shape of the display region 43 of the organic EL display panel 42 is not a rectangular or square shape, and has an irregular shape different from the rectangular or square shape.

The irregular shape refers to a shape in which at least a portion of an edge (a side or a corner) of a rectangular or square shape of an external shape of an organic EL display panel includes an irregular-shape portion protruding inwardly (toward a central portion of the rectangular or square shape) or outwardly (in a direction away from the central portion of the rectangular or square shape) from this edge. That is, in a case where an external shape of an organic EL display panel is a rectangular or square shape, the irregular-shape portion refers to a portion having a shape different from the rectangular or square shape.

In FIGS. 1A and 1B, in the display region 43 of the organic EL display panel 42, four corners 43a to 43d each have, for example, a curved shape (arc shape), rather than a right-angled shape, that is, a so-called rounded shape (round shape). Further, the display region 43 of the organic EL display panel 42 has, for example, a shape in which at least one side of the four sides has a notched portion 43e recessed to protrude from the edge in a direction toward the central portion of the display region 43. The notched portion 43e has, for example, an arc shape. An external shape of the frame region of the organic EL display panel 42 has a narrow width, and is substantially the same shape as the external shape of the display region 43.

In addition, as illustrated in FIG. 1B, in this embodiment, the display region 43 of the organic EL display panel 42 has a cross section in which both longer sides and the vicinity of both the longer sides are curved.

The camera 36 and the speaker 34 are disposed in a region of the housing 32 surrounded by the notched portion 43e.

Note that the shape of the external shape of the organic EL display panel 42 is merely an example, and may be other irregular shape. Hereinafter, a method for manufacturing the organic EL display panel 42 having the external shape being an irregular shape will be described.

Outline of Method for Manufacturing Organic EL Display Panel

Figure 2:
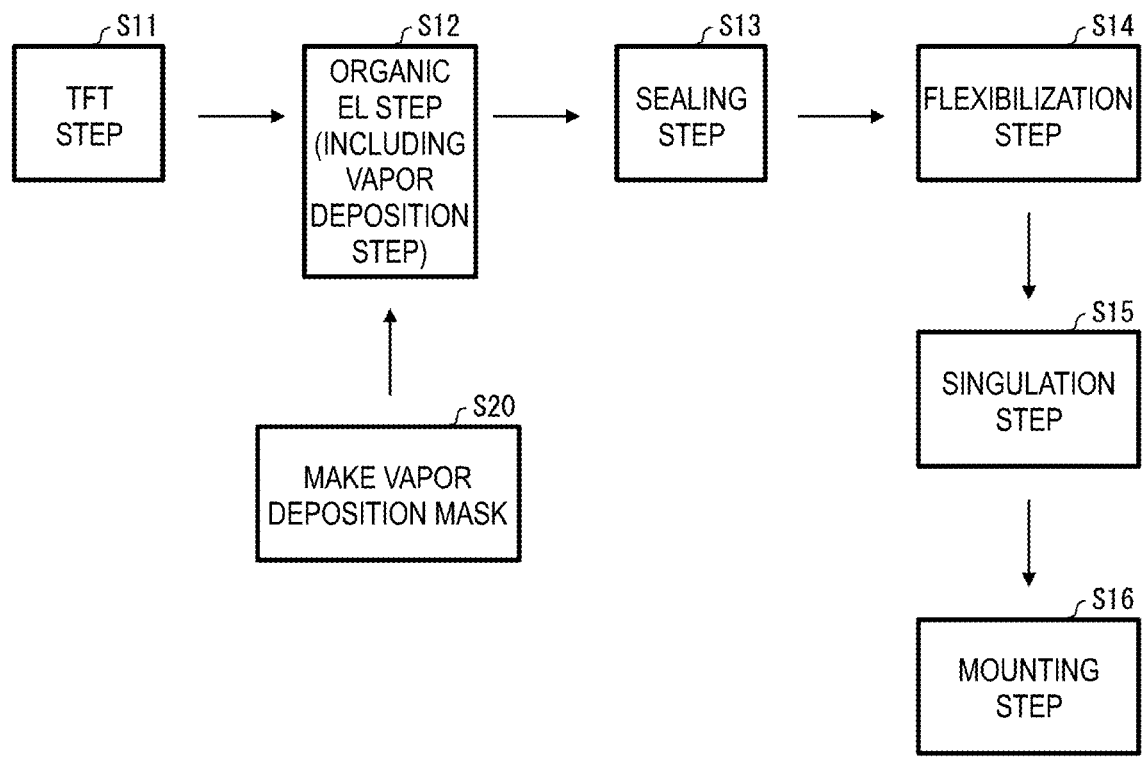
FIG. 2 is a view illustrating manufacturing steps for the organic EL display panel according to the first embodiment.
Figure 3:
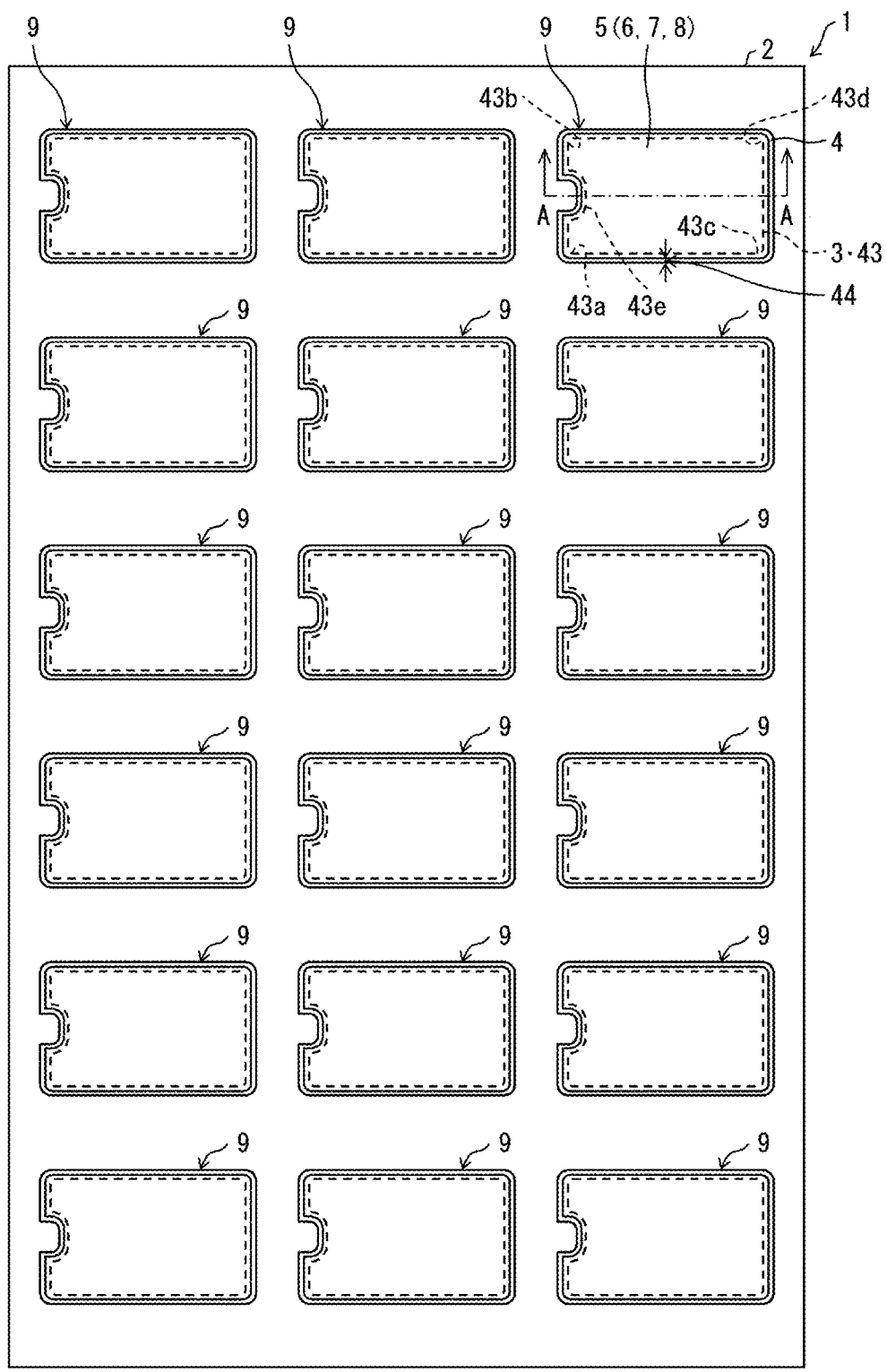
FIG. 3 is a plan view illustrating a substrate of the organic EL display device according to the first embodiment.
Figure 4:
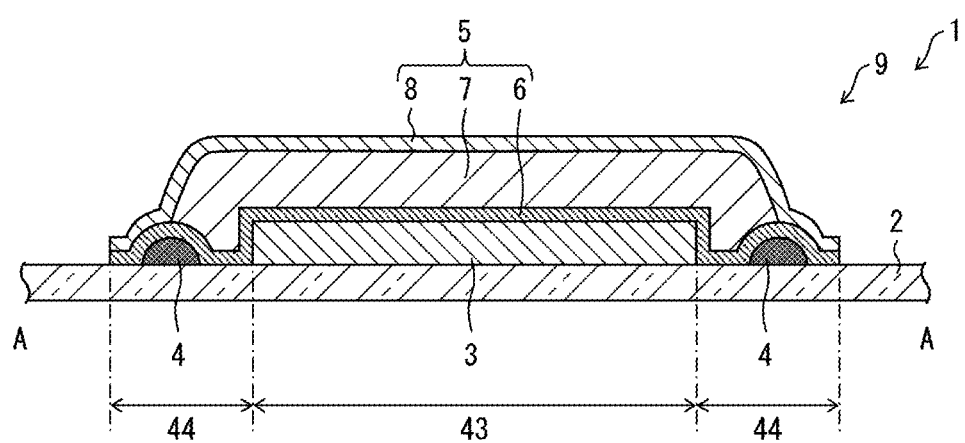
FIG. 4 is a cross-sectional view illustrating an organic EL display panel formation region of the substrate illustrated in FIG. 3.

FIG. 2 is a view illustrating manufacturing steps for the organic EL display panel according to the first embodiment. FIG. 3 is a plan view illustrating a substrate 1 of the organic EL display device according to the first embodiment of the disclosure. FIG. 4 is a cross-sectional view illustrating an organic EL display panel formation region of the substrate illustrated in FIG. 3. FIG. 3 illustrates a configuration in a case where 18 organic EL display panels are obtained from one mother glass. Note that the number of the organic EL display panels obtained from one mother glass is not limited to 18, and may be 17 or less or may be 19 or more.

On the substrate 1, 18 organic EL display panel formation regions 9 are disposed. Each of the organic EL display panel formation regions 9 is a region cut out from the mother glass into an individual piece and then to be an organic EL display panel.

The substrate 1 includes a TFT substrate (vapor target substrate) 2, an active region 3, a frame-shaped bank 4, and a sealing layer 5.

A plurality of the active regions 3 are provided in a matrix shape. The active region 3 is, for example, a region in which pixels with RGB are formed. In the organic EL display panel formation region 9, a region where the active region 3 is formed is the display region 43, and in the organic EL display panel formation region 9, a peripheral region surrounding the active region 3 is the frame region 44. Note that, in FIG. 3, the frame region 44 is a region located outside of a region (active region 3) indicated by a dashed line in the organic EL display panel formation region 9.

As illustrated in FIGS. 2 to 4, the TFT substrate 2 is first made at TFT step S11. The TFT substrate 2 is made by: forming, on a mother glass, a film serving as a base for a flexible substrate by using a material such as polyimide; forming, on the film by a known method, a TFT (transistor and driving element), gate wiring lines, source wiring lines, and other various types of wiring lines present in a pixel circuit provided in each pixel; forming a passivation film (protection film), an interlayer insulating film (surface leveling film), and the like; and forming, on an inorganic insulating film, a reflective electrode layer being in contact with an anode, an ITO layer, and a pixel bank (edge cover) for defining a light emitting region.

Accordingly, the light emitting region is formed on the active region 3.

The passivation film prevents peeling of a metal film in the TFT, and protects the TFT. The passivation film is formed on the mother glass or via another layer, and covers the TFT. The passivation film is an inorganic insulating film including silicon nitride, silicon oxide, and the like.

The interlayer insulating film provides a leveled surface over irregularities on the passivation film. The interlayer insulating film is formed on the passivation film. The interlayer insulating film is an organic insulating film made of a photosensitive resin such as acrylic, or made of a thermoplastic resin such as polyimide.

In addition, at the time of forming this active region 3, the frame-shaped bank 4 surrounding the active region 3 in a frame shape is also formed on the TFT substrate 2. The frame-shaped bank 4 is made of a photosensitive resin such as acrylic, or of a thermoplastic resin such as polyimide.

Next, at organic EL step S12, an organic EL layer is formed on the reflective electrode layer in each pixel (that is, within an opening of a pixel bank formed at TFT step S11) of the TFT substrate 2. The organic EL layer includes the light-emitting layer, a hole transport layer, and other function layers. The light-emitting layer emits light of a different color such as red, green, or blue for each pixel. At the vapor deposition step, a layer (vapor-deposition layer) vapor-deposited for each pixel such as the light-emitting layer and the hole transport layer is formed at a predetermined position of each pixel by vapor deposition using a vapor deposition mask according to this embodiment in a vacuum.

The vapor deposition mask used at the vapor deposition step for forming the vapor-deposition layer vapor-deposited on each pixel such as the light-emitting layer and the hole transport layer is made in advance prior to the vapor deposition step at vapor deposition mask making step S20. Note that details of vapor deposition mask making step S20 will be described later. In addition, the layers formed by using this vapor deposition mask are not limited to the light-emitting layer and the hole transport layer, and may be any layer formed for each pixel (that is, in an opening of the pixel bank).

Then, a transparent electrode facing the reflective electrode via the organic EL layer is formed to cover the organic EL layer.

Then, next, the sealing layer 5 is formed at sealing step S13. As an example, the sealing layer 5 can include a three layer structure including the inorganic layer 6, the organic layer 7, and the inorganic layer 8 layered in this order from the TFT substrate 2 side. Since the frame-shaped bank 4 is formed, the organic film 7 can be formed to have a large film thickness of, for example, 1.0 μm or greater.

After this sealing layer 5 is formed, flexible step S14 is performed. At flexible step S14, the glass of the substrate is peeled off, and a film or the like serving as a support body is affixed.

Then, next, at singulation step S15, each organic EL display panel formation region 9 is cut out. Accordingly, each organic EL display panel formation region 9 is obtained as an individual piece. Accordingly, a display panel (organic EL display panel) having flexibility and an irregular shape is formed.

Then, at mounting step S16, a member such as a driver is mounted on each organic EL display panel formation region 9 obtained as an individual piece. Accordingly, the organic EL display device is complete.

In this embodiment, the active region 3 has, for example, an irregular shape different from a rectangular or square shape, and hence, the external shape of the display panel also has an irregular shape corresponding to the shape of the active region 3.

Figure 5:
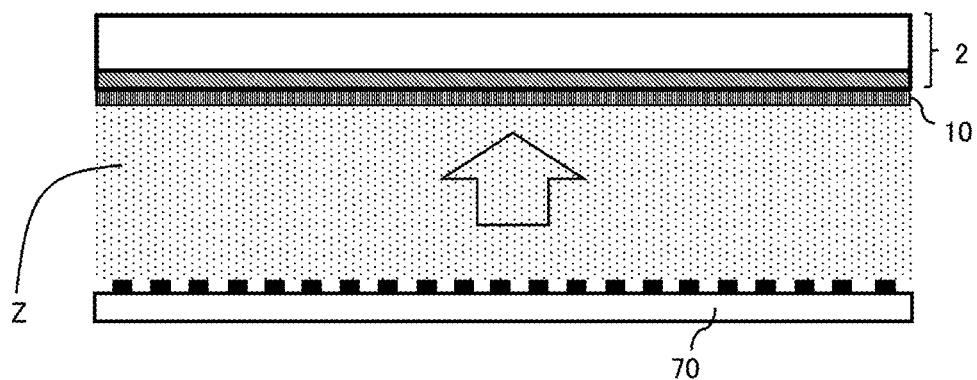
FIG. 5 is a schematic view illustrating a state at a vapor deposition step at the time of forming a light-emitting layer of the organic EL display device according to the first embodiment.

FIG. 5 is a schematic view illustrating a state at the vapor deposition step at the time of forming the vapor-deposition layer of the organic EL display device according to the first embodiment of the disclosure.

At the vapor deposition step for vapor-depositing the vapor-deposition layer, a vapor deposition mask 10 provided with a mask sheet 15 including a plurality of through-holes is brought into close contact with the TFT substrate 2, and in a vacuum, vapor deposition particles Z (for example, an organic light-emitting material) caused to evaporate with a vapor deposition source 70 are vapor-deposited on pixels of the TFT substrate 2 through the mask sheet 15. Accordingly, a vapor deposition pattern corresponding to the through-holes of the mask sheet 15 is formed on the TFT substrate 2.

Here, the external shape of the active region 3 (see, FIGS. 1A and 1B, 3, and 4) is an irregular shape different from a rectangular or square shape. For example, the active region 3 has an irregular shape in which four corners 43a to 43d each have a round shape, rather than a right-angle shape, and further at least one side of the four sides has the notched portion 43e recessed from the edge in a direction toward the central portion of the display region. Hence, vapor deposition holes corresponding to the shapes of the active regions 3 are also formed to be arranged on the vapor deposition mask used at the vapor deposition step.

Figure 6:
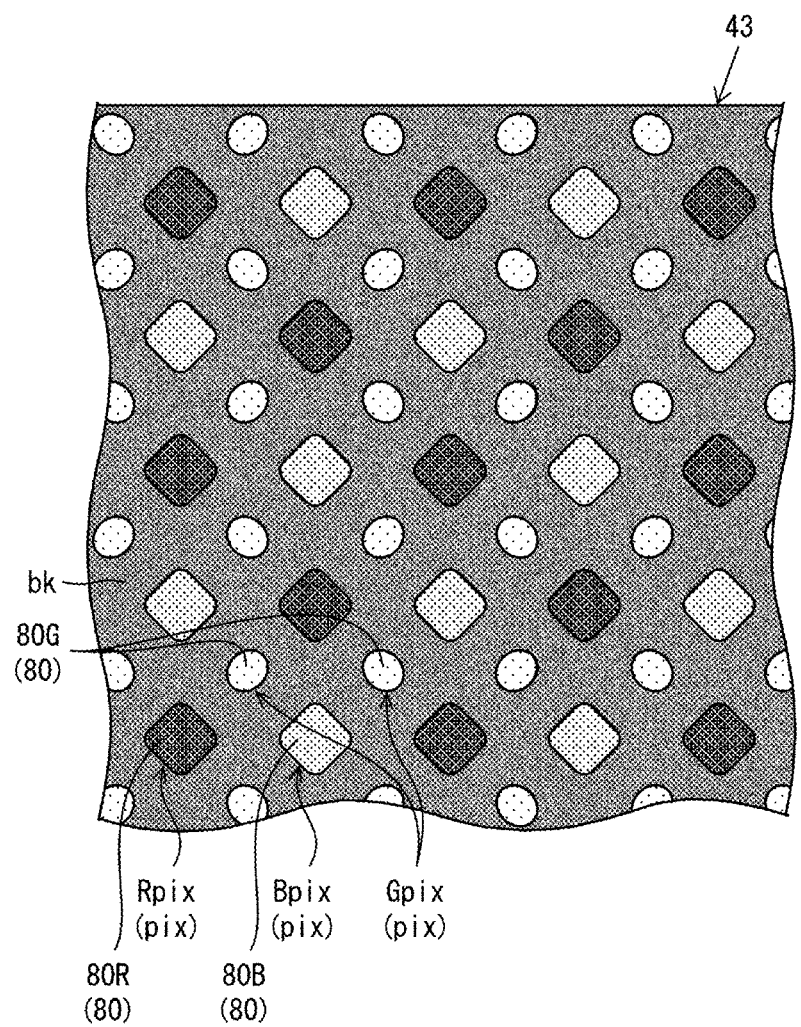
FIG. 6 is an enlarged view of a portion of an active region 3 according to the first embodiment.

FIG. 6 is an enlarged view of a portion of the active region 3 according to the first embodiment. On the active region 3, pixels pix contributing to displaying of an image are disposed to be arranged in a matrix shape. On each of the pixels pix, the light-emitting layer 80 is formed. A peripheral region surrounding the pixels pix serves as a pixel bank bk.

As an example, in FIG. 6, a red pixel Rpix on which a red light-emitting layer 80R configured to emit red light is formed, a green pixel Gpix including a green light-emitting layer 80G configured to emit green light, and a blue pixel Bpix including a blue light-emitting layer 80B configured to emit blue light are arranged in a pentile matrix. However, the pixel arrangement is not particularly limited to the pentile matrix, and may be other arrangement such as stripe arrangement.

Note that a shape of the light-emitting layer 80 is a shape of an opening of the pixel bank bk in which the light-emitting layer 80 is formed.

Vapor Deposition Mask

Figure 7:
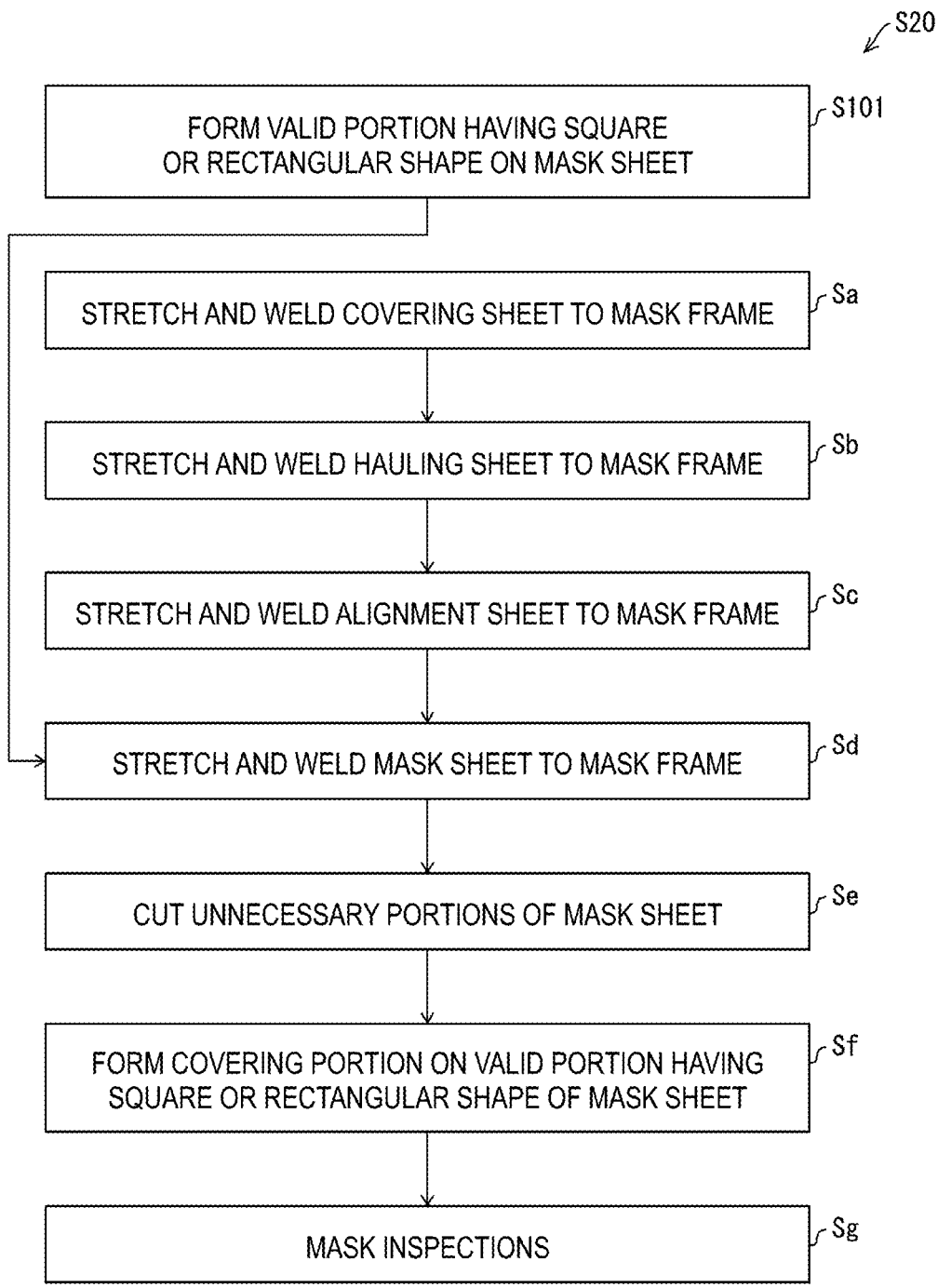
FIG. 7 is a view illustrating the vapor deposition step for the light-emitting layer of the organic EL display panel according to the first embodiment.
Figure 8A:
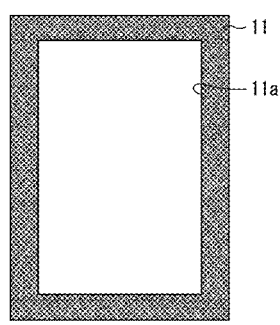
FIGS. 8A to 8F are views each illustrating a state where a vapor deposition mask according to the first embodiment is made.
Figure 8B:
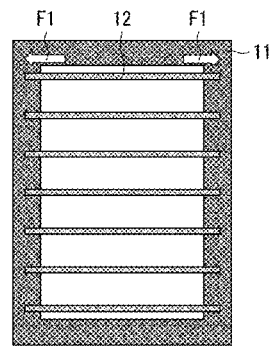
Figure 8C:
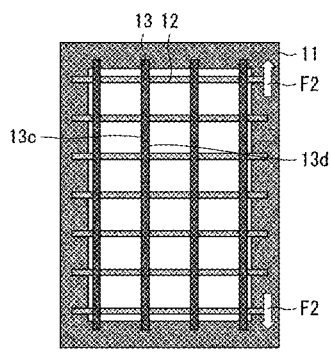
Figure 8D:
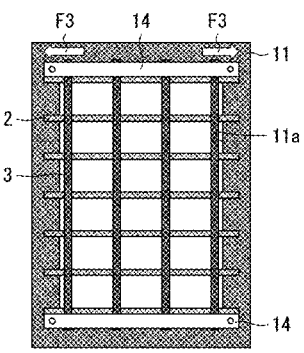
Figure 8E:
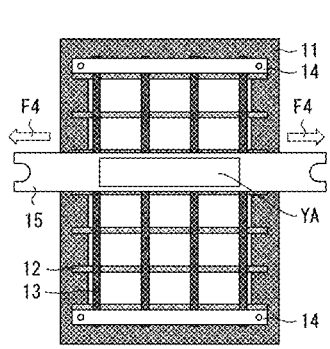
Figure 8F:
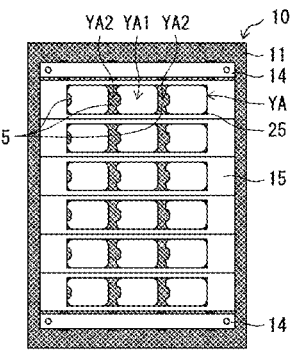

Next, vapor deposition mask making step S20 for the vapor deposition mask used at the vapor deposition step will be described. FIG. 7 is a view illustrating the vapor deposition step for the light-emitting layer of the organic EL display panel according to the first embodiment. FIGS. 8A to 8F are views each illustrating a state where the vapor deposition mask according to the first embodiment is made. FIG. 8A is a plan view illustrating the mask frame. FIG. 8B is a view illustrating a state where a covering sheet is attached to the mask frame. FIG. 8C is a view illustrating a state where a hauling sheet is attached to the mask frame. FIG. 8D is a view illustrating a state where an alignment sheet is attached to the mask frame. FIG. 8E is a view illustrating a state where a mask sheet is attached to the mask frame. FIG. 8F is a plan view illustrating the vapor deposition mask made.

As illustrated at step Sa in FIG. 7 and illustrated in FIGS. 8A and 8B, a plurality of covering sheets 12 are attached to the mask frame 11 having a frame shape and including a frame opening 11a in a region surrounded by the frame (covering-sheet attachment step).

For example, an invar material or the like having a significantly low thermal expansion and a thickness ranging from 20 mm to 30 mm is used as a base material of the mask frame 11. The mask frame 11 is sufficiently thick relative to the mask sheet, and has high rigidity to enable sufficient accuracy to be secured even at the time of stretching and welding the mask sheet.

The covering sheet 12 serves to fill a gap between mask sheets to be attached to the mask frame 11 later, and close a dummy pattern formed on the mask sheet.

For example, an invar material or the like having a thickness ranging from 30 μm to 50 μm is used as a base material of the covering sheet 12. The covering sheet 12 has an elongated shape, and extends in a straight manner from one end portion to the other end portion.

At the time of attachment of the covering sheet 12 to the mask frame 11, both the end portions of the covering sheet 12 are welded to the inside of a groove provided in the mask frame 11 while both the end portions of the covering sheet 12 are stretched (pulled) by application of force to each of both the end portions in an outward direction (in a direction away from each other) as indicated by arrow F1 in FIG. 8B. Then, unnecessary portions of the covering sheet 12 located outside of the welded portions are cut off. Accordingly, each of the covering sheets 12 is attached at a predetermined position of the mask frame 11. In this embodiment, the covering sheets 12 are attached to the mask frame 11 to be parallel to each other in the shorter side direction of the mask frame 11. The covering sheets 12 are attached to the mask frame 11 to be arranged on the longer side of the mask frame 11 and to be parallel to each other.

Next, as illustrated at step Sb in FIG. 7 and illustrated in FIG. 8C, a hauling sheet 13 (also referred to as a support sheet) is attached to the mask frame 11 to which the covering sheet 12 is attached (hauling-sheet attachment step).

The hauling sheet 13 serves to support a mask sheet to be attached subsequently to the mask frame 11 to prevent the mask sheet from loosening, and serves to close a dummy pattern formed on the mask sheet.

For example, an invar material or the like having a thickness ranging from 30 μm to 100 μm is used as a base material of the hauling sheet 13. A width of the hauling sheet 13 ranges, for example, from approximately 8 mm to 10 mm, and is determined according to layout on the substrate on which a panel is disposed. The howling sheet 13 has an elongated shape, and extends in a straight manner from one end portion to the other end portion.

In a display panel having a portrait shape, a terminal portion is typically masked with a hauling sheet, and hence, the width of the hauling sheet is greater than a width of the covering sheet. However, the hauling sheet is disposed at a position not overlapping with the display region (namely, the valid portion of the mask sheet) of the display panel.

At the time of attachment of the hauling sheet 13 to the mask frame 11, both end portions of the hauling sheet 13 are welded to the inside of the groove provided in the mask frame 11 while both the end portions of the hauling sheet 13 are stretched (pulled) by application of force to each of both the end portions of the hauling sheet 13 in an outward direction (in a direction away from each other) as indicated by arrow F2 in FIG. 8C. Then, unnecessary portions of the hauling sheet 13 located outside of the welded portions are cut off. Accordingly, each hauling sheet 13 is attached at a predetermined position of the mask frame 11.

In this embodiment, each hauling sheet 13 is attached to the mask frame 11 to be parallel to the longer side of the mask frame 11. The hauling sheets 13 are attached to the mask frame 11 to be arranged in the shorter side direction of the mask frame 11 and to be parallel to each other.

Note that the order of attachment of the covering sheet 12 and the hauling sheet 13 to the mask frame 11 (reverse the order of step Sa and step Sb in FIG. 7) may be reversed, and the hauling sheet 13 may be first attached to the mask frame 11, and then, the covering sheet 12 may be attached to the mask frame 11.

The plurality of covering sheets 12 and the plurality of hauling sheets 13 are attached to the mask frame 11 in a lattice pattern as illustrated in FIG. 8C, and accordingly, openings defined by the covering sheets 12 facing each other and the hauling sheets 13 facing each other are formed to be arranged.

Next, as illustrated at step Sc in FIG. 7 and illustrated in FIG. 8D, an alignment sheet 14 including an alignment mark formed is attached to the mask frame 11 to make the alignment mark located at a predetermined position (alignment-sheet attachment step).

At the time of attachment of the alignment sheet 14 to the mask frame 11, both end portions of the alignment sheet 14 are welded to predetermined positions of the mask frame 11 while both the end portions of the alignment sheet 14 are stretched (pulled) by application of force to each of both the end portions of the alignment sheet 14 in an outward direction (in a direction away from each other) and in a direction parallel to the short-hand direction of the mask frame 11 as indicated by arrow F3 in FIG. 8D. Then, unnecessary portions of the alignment sheet 14 located outside of the welded portions are cut off. Accordingly, each of the alignment sheets 14 is attached at a predetermined position of the mask frame 11. In this embodiment, two alignment sheets 14 are attached to the mask frame 11 to be parallel to each other along the shorter side of the frame opening 11a of the mask frame 11.

Next, as illustrated at step Sd in FIG. 7 and illustrated in FIG. 8E, a plurality of the mask sheets 15 are attached to the mask frame 11 (mask-sheet attachment step). The mask sheets 15 are sheets used, for example, for separately patterning RGB to pattern and form the vapor-deposition layer in pixels in the active region 3 illustrated in FIGS. 3 and 4.

Prior to this step Sd and before the mask sheets 15 are attached to the mask frame 11, vapor deposition holes are formed to be arranged in a square or rectangular shape, and thereby, a valid portion YA is formed on the mask sheet 15 at step S101 (valid-portion forming step). The valid portion YA extends across the plurality of active regions 3, namely, has area substantially overlapping with the plurality of active regions 3. Details of the structure of this valid portion YA will be described later.

At step Sd, at the time of attachment of the mask sheet 15 to the mask frame 11, both end portions of the mask sheet 15 are accurately welded at predetermined positions of the mask frame 11 to make the vapor deposition hole constituting the valid portion YA located at a predetermined position by using the alignment mark formed on the alignment sheet 14 as a reference while both the end portions of the mask sheet 15 are stretched (pulled) by application of force to each of both the end portions of the mask sheet 15 in an outward direction (in a direction away from each other) as indicated by arrow F4 in FIG. 7E.

In addition, at the time of stretching and welding the mask sheet 15, the stretching and the welding are performed while counter force is applied to the mask frame 11 according to an amount of deformation of the mask sheet 15 obtained after the stretching and the welding.

Here, an external shape of the valid portion YA formed on the mask sheet 15 is not an irregular shape but a square or rectangular shape. Hence, as compared with a mask sheet including a valid portion having an irregular shape, stress applied on the mask sheet when the mask sheet 15 is stretched can be prevented from being nonuniform. Accordingly, positional offset of the vapor deposition hole in the vapor deposition mask can be prevented, and the mask sheet 15 can be attached to the mask frame 11 with high accuracy.

Then, after all the necessary sheets of the mask sheets 15 are attached to the mask frame 11 to cause all the openings defined by the covering sheets 12 and the hauling sheets 13 to be covered with the valid portions YA as illustrated in FIG. 8F, unnecessary portions of the mask sheets 15 located outside of the welded portions are cut off as illustrated at step Se in FIG. 7 and illustrated in FIG. 8F.

Next, in the valid portion YA having a square or rectangular shape of the mask sheet 15, a covering portion 25 configured to cover vapor deposition holes is formed at the outside of the shape corresponding to the shape of the active region 3 (see FIG. 3), and thereby a first region YA having a shape corresponding to the shape of the active region 3 and a second region YA2 provided with the covering portion 25 are formed (covering-portion forming step). The first region YA is formed for each active region 3.

Accordingly, the vapor deposition mask 10 is complete.

Next, as illustrated at step Sg in FIG. 7, the vapor deposition mask 10 complete is cleaned, and various mask inspections such as inspection for foreign matters and inspection for accuracy are performed. Subsequently, vapor deposition masks 10 having no problem found in the mask inspections are stored in a stocker, and are supplied to a vapor deposition apparatus used at the vapor deposition step as needed.

Note that the order of step Se and step Sf may be reversed, and the covering portion 25 may be formed in the valid portion YA of the mask sheet 15 (step Sf) and then, the unnecessary portions of the mask sheet 15 may be cut (step Se).

Valid Portion YA

Figure 9A:
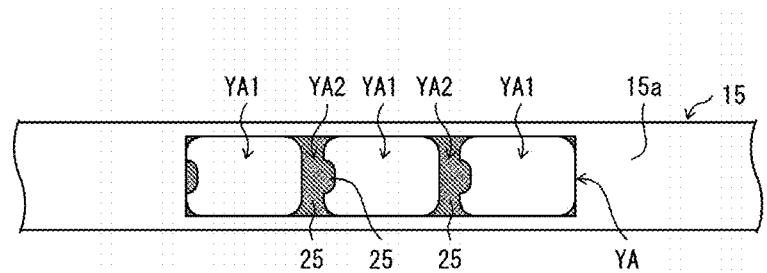
Figure 9B:
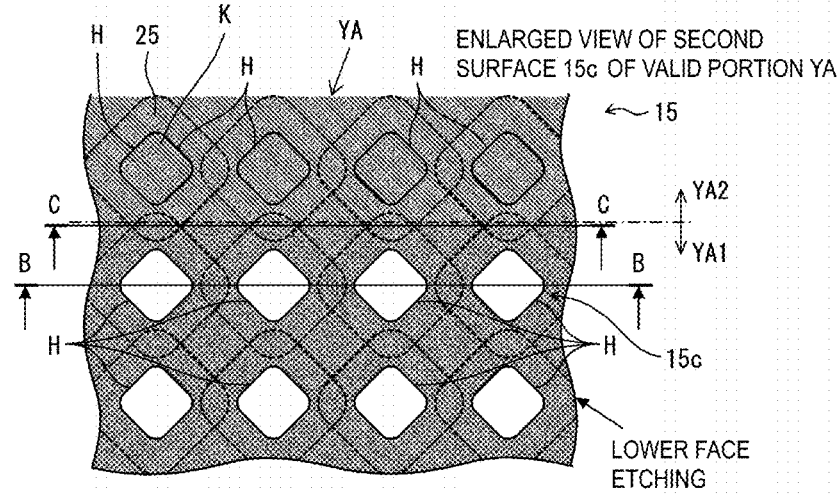
Figure 9B:
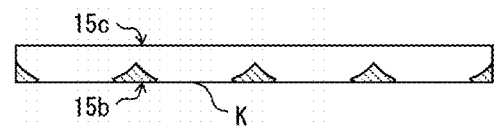
Figure 9B:
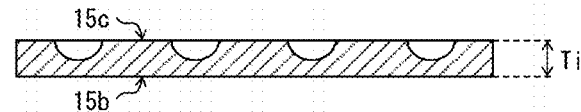

FIGS. 9A to 9D are views each illustrating a configuration of the mask sheet 15. FIG. 9A is a plan view of the mask sheet 15. FIG. 9B is an enlarged view of the valid portion illustrated in FIG. 9A. FIG. 9C is a cross-sectional view taken along line B-B illustrated in FIG. 9B. FIG. 9D is a cross-sectional view taken along line C-C illustrated in FIG. 9B.

As illustrated in FIG. 9A, the mask sheet 15 includes a sheet portion 15a and the covering portion 25. The sheet portion 15a has a strip shape, and for example, an invar material or the like having a thickness ranging from 10 µm to 50 µm, preferably, a thickness of approximately 25 µm is used as a base material of the sheet portion 15a.

The material for constituting the covering portion 25 is not limited to a resin, but is preferably a resin. This is because the covering portion 25 can be formed by application such as an ink-jet method as described later.

As the resin used to constitute the covering portion 25, a thermosetting resin or a photocurable resin such as a resin photocurable with ultraviolet light can be used. In a case where a thermosetting resin is used to constitute the covering portion 25, an example of the thermosetting resin can include polyimide. In a case where a photocurable resin is used to constitute the covering portion 25, examples of the photocurable resin can include a high-durable acrylic resin, or an acrylic and/or epoxy resin.

The photocurable resin is more preferably used to constitute the covering portion 25 than the thermosetting resin. This is because, in a case where the covering portion 25 is cured by application of heat, heat is also applied to the mask sheet 15, and unnecessary force is applied on the mask sheet 15 due to differences in an expansion rate and a contraction rate between an invar material (metal) and a resin. In particular, in the case of the thermosetting resin, even when the mask sheet 15 is made of a material having a low thermal expansion coefficient such as an invar material, the material is cured in a state where the material is slightly expanded owing to an increase in temperature for curing, and there is a possibility that accuracy cannot be maintained.

Thus, a photocurable resin is used to constitute the covering portion 25, and thereby, it becomes unnecessary to apply heat at the time of curing the covering portion 25 being in a liquid state and having been applied, and an influence on the accuracy, peeling-off of a covering resin, and generation of a wrinkle on the mask sheet, each of which is caused by a difference in a thermal expansion rate between a covering material (resin) and an invar material can be reduced. Accordingly, positional accuracy of a mask sheet can be maintained.

To prevent the vapor-deposited light-emitting layer from having a nonuniform thickness, the sheet portion 15a of the mask sheet 15 includes a sheet having a small thickness.

The valid portion YA extending in the longitudinal direction of the mask sheet 15 is formed between both the end portions of the mask sheet 15. In the valid portion YA, a plurality of vapor deposition holes H each corresponding to a pixel are formed.

The external shape of the valid portion YA is a square or rectangular shape, rather than an irregular shape to make stress as uniform as possible. In this embodiment, the external shape of the valid portion YA is a rectangular shape. The valid portion YA has area overlapping with the plurality of active regions 3 of the TFT substrate 2.

The valid portion YA has a first region YA1 and a second region YA2. The first region YA1 is formed for each active region 3 (see FIG. 3), and has a shape corresponding to the shape of the active region 3. The second region YA2 is a region located outside of the first region YA1 in the valid portion YA, and provided with the covering portion 25 configured to cover a portion of a vapor deposition hole of the plurality of vapor deposition holes present in the valid portion YA.

The covering portion 25 is provided on the sheet portion 15a and at a portion not overlapping with the active region 3 of the TFT substrate 2 in the valid portion YA. The covering portion 25 defines a shape of each first region YA1 having an irregular-shape portion.

As illustrated in FIG. 9B, in the valid portion YA, the vapor deposition holes H present in the first region YA penetrate, and the vapor deposition holes H present in the second region YA2 are covered with the covering portion 25. The covering portion 25 does not need to be provided for each vapor deposition hole H present in the second region YA2, and may be formed to extend across each vapor deposition hole H present in the second region YA2. Accordingly, positional accuracy for application of the covering material serving as the covering portion 25 at the time of application by an ink-jet method may be slightly low.

The vapor deposition holes H present in the first region YA are vapor deposition holes for patterning and forming of the vapor-deposition layer for each pixel. The vapor deposition holes H present in the second region YA2 are dummy vapor deposition holes not contributing to patterning and forming of the vapor-deposition layer for each pixel.

At the vapor deposition step, the first region YA1 of the valid portion YA of the mask sheet 15 overlaps with the active region 3 (see FIGS. 3 and 4) of the TFT substrate 2, and the second region YA2 located outside of the first region YA1 and an edge portion surrounding the valid portion YA overlap with the frame region 44 (see FIGS. 3 and 4). Then, vapor deposition particles coming from the vapor deposition source pass through the vapor deposition holes H present in the first region YA1, and are vapor-deposited on pixels of the active region 3 of the TFT substrate 2. At this time, the second region YA2 and the edge portion surrounding the valid portion YA of the mask sheet 15 overlap with the frame region 44 of the TFT substrate 2, and hence, vapor deposition particles are blocked by the second region YA2 and the edge portion surrounding the valid portion YA, and do not arrive at portions between pixels and at the frame region 44.

In a case where the light-emitting layer is vapor-deposited on the TFT substrate through the mask sheet 15, the vapor deposition holes H are formed in the valid portion YA to correspond to a formation region for a light-emitting layer configured to emit any color of colors that light-emitting layers emit. For example, in a case where a light-emitting layer configured to emit red light, a light-emitting layer configured to emit green light, and a light-emitting layer configured to emit blue light are formed in the active region 3, the vapor deposition holes H are formed in the same pattern as a pattern of any light-emitting layer of the light-emitting layer configured to emit red light, the light-emitting layer configured to emit green light, and the light-emitting layer configured to emit blue light.

The vapor deposition holes H of the second region YA2 are the same as the vapor deposition holes H of the first region YA1 in a pitch and a shape. Namely, the vapor deposition holes H provided between the first regions YA1 are the same as the vapor deposition holes H provided in the first regions YA1 in a pitch and a shape.

The valid portion YA includes a combination of the first region YA1 and the second region YA2, and has a rectangular or square shape, rather than an irregular shape.

At step S101 illustrated in FIG. 7, vapor deposition holes are made in the sheet portion 15a of the mask sheet 15, for example, in the following manner.

First, a negative-working or positive-working photosensitive resist is applied to both surfaces of the sheet portion 15a being an elongated plate made of an invar material to form a resist film on both main surfaces (a first surface and a second surface).

Then, the resist films of the first surface and the second surface are subjected to exposure and developing by using an exposure mask to form a resist pattern on both the surfaces of the sheet portion 15a. Then, the resist pattern on the first surface is used as a mask to perform etching of a first surface 15b (surface facing the TFT substrate 2 at the time of vapor deposition) of the valid portion YA (etching of an upper face of the edge portion is not performed) to pattern and form openings K in the first surface 15b of the valid portion YA (at this stage, openings K are still not vapor deposition holes having penetrated).

Then, the first surface 15b is covered with an etching resistant resin, and the resist pattern on a second surface 15c (surface opposite to the surface facing the TFT substrate 2 at the time of vapor deposition) is used as a mask to perform etching of the valid portion YA and of a lower face of the edge portion. Accordingly, the vapor deposition holes H (through-holes) are formed in the valid portion YA by erosion from the second surface 15c side to form a plurality of recesses on the lower face of the edge portion.

The plurality of vapor deposition holes H of the valid portion YA are formed in a matrix shape or an oblique lattice pattern in the longitudinal direction and the short-hand direction (width direction) of the mask sheet 15. The openings K of the plurality of vapor deposition holes H (openings on the upper face) are each shaped into a quadrangle shape including corners rounded or a circular shape or an elliptic shape to correspond to the shape of an opening of a pixel bank layer of the substrate. In the valid portion YA, etching of each of the vapor deposition holes H from the second surface 15c side is performed in a more extensive and deeper manner than from the first surface 15b side. Thereby, a shading portion (a height of a partition between two adjacent vapor deposition holes) is made small to increase accuracy in vapor deposition and efficiency in vapor deposition relative to the substrate.

The valid portion YA includes a configuration in which as a cross section is taken along line B-B passing through the center of two openings K adjacent in the lateral direction, the base material is minimum (cavity is maximum) as illustrated in FIG. 9C; and as a cross section is taken along line C-C passing through a point located equidistant from two openings K adjacent in the vertical direction, the base material is maximum (cavity is minimum: a maximum thickness is equal to a thickness Ti of the base material) as illustrated in FIGS. 9C and 9D.

Accordingly, the mask sheet 15 to be stretched over the mask frame 11 and welded to the mask frame 11 (FIG. 8E) is made.

As described above, after the mask sheet 15 is fixed to the mask frame 11, the covering portion 25 is formed on a portion of the valid portion YA as illustrated at step sf in FIG. 7 and illustrated in FIG. 8F.

Figure 10A:
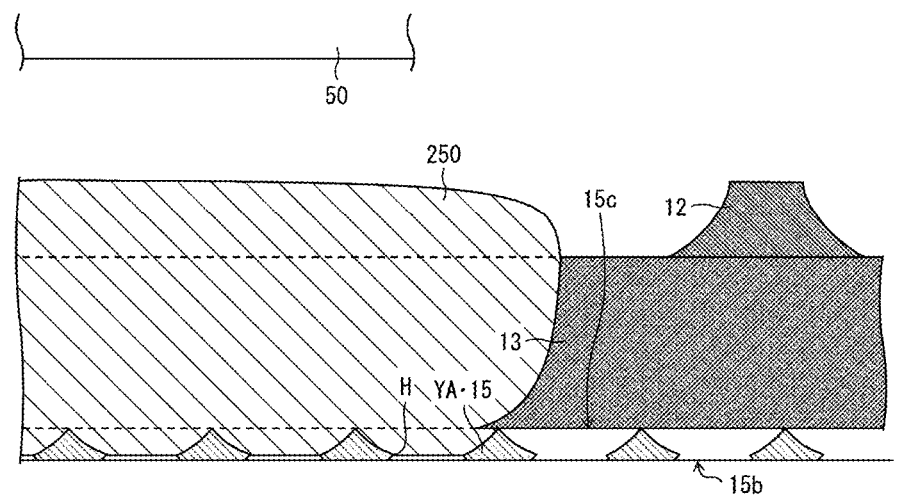
FIGS. 10A and 10B are views each illustrating a state where a covering portion is formed on a valid portion of the mask sheet according to the first embodiment.
Figure 10B:
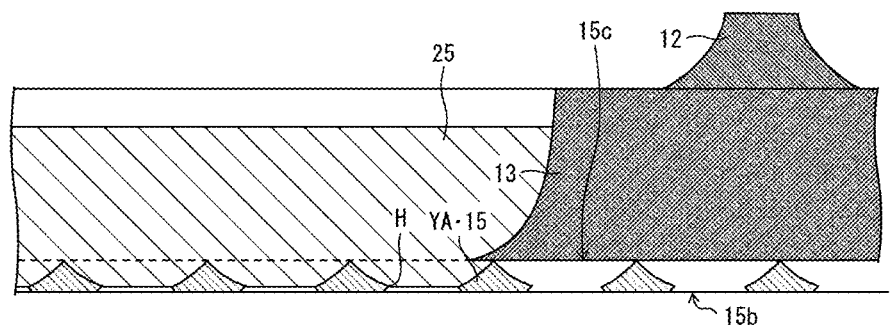

FIGS. 10A to 10B are views each illustrating a state where the covering portion 25 is formed on the valid portion YA of the mask sheet 15, FIG. 10A is a view illustrating a state where a covering material 250 is applied to the valid portion YA of the mask sheet 15, and FIG. 10B is a view illustrating a state where the covering material 250 is cured.

As one example, the case where the covering portion 25 is formed by using an ink-jet method will be described.

After the predetermined number of the mask sheets 15 are welded to the mask frame 11 as illustrated in FIGS. 8E and 8F, the mask sheets 15 each are set with the first surface 15b facing downward and the second surface 15c facing upward as illustrated in FIG. 10A.

Then, from the head of the inkjet device 50, the covering material 250 is applied to a region located on the second surface 15c of the valid portion YA and to be the second region YA2 (application step).

Then, when a predetermined amount of the covering material 250 is applied, the covering material 250 applied is cured (curing step). Accordingly, the covering portion 25 is formed on the second region YA2 of the valid portion YA as illustrated in FIG. 10B.

Figure 11:
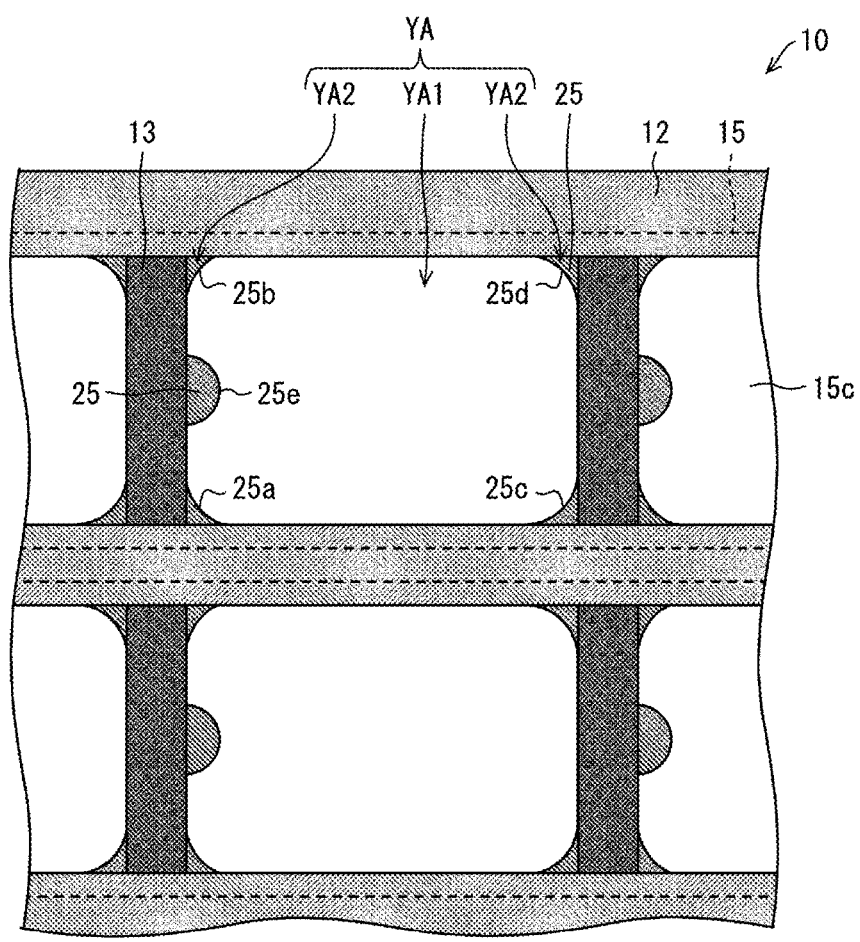
FIG. 11 is a view illustrating a state of a portion of the vapor deposition mask according to the first embodiment as viewed from a second surface side.
Figure 12:
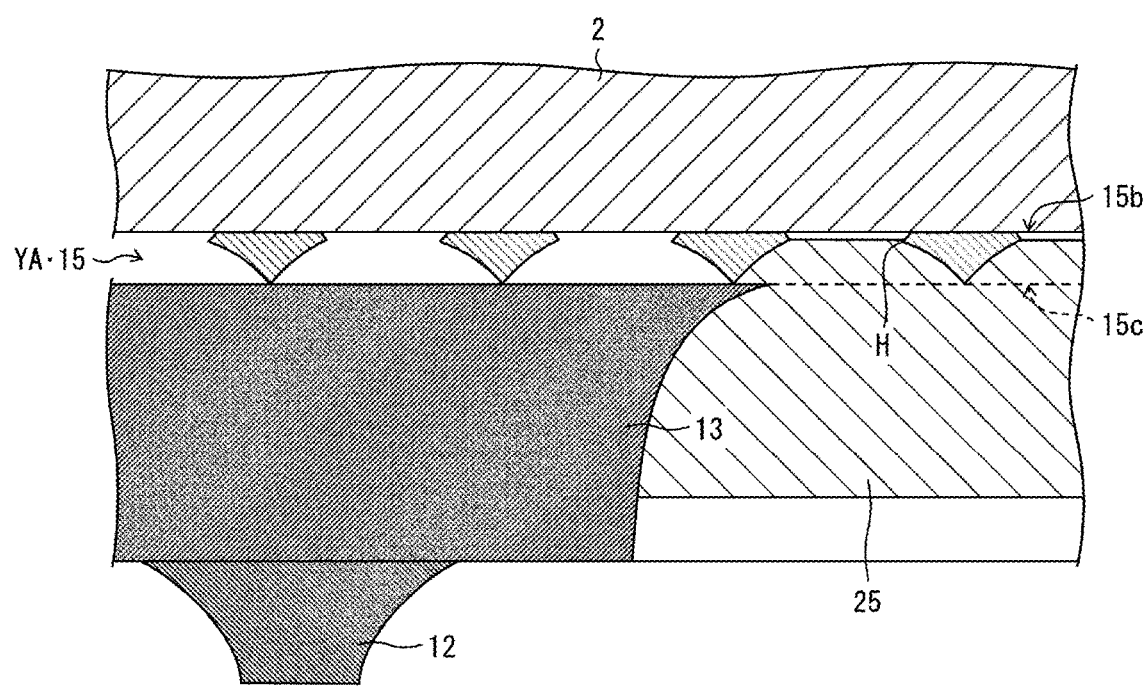
FIG. 12 is a cross-sectional view illustrating a vapor deposition mask and a TFT substrate at the time of performing vapor deposition at a vapor deposition step according to the first embodiment.

FIG. 11 is a view illustrating a state of a portion of the vapor deposition mask 10 as viewed from the second surface 15c side. FIG. 12 is a cross-sectional view of the vapor deposition mask 10 and the TFT substrate 2 at the time of performing vapor deposition at the vapor deposition step.

As illustrated in FIGS. 11 and 12, the covering portion 25 is provided on the second surface 15c of the mask sheet 15 located on the opposite side to the first surface 15b facing the TFT substrate 2. Hence, the first surface 15b of the mask sheet 15 can be prevented from having a raised shape due to the covering portion 25. Accordingly, the first surface 15b and the TFT substrate 2 can be brought into close contact with each other at the time of vapor deposition of the TFT substrate 2. As a result, a shadow due to the covering portion 25 can be prevented from occurring at the time of vapor deposition of the TFT substrate 2.

Note that the covering portion 25 may be layered not only on the valid portion YA but also on the covering sheet 12 between the valid portions YA and on the hauling sheet 13. In this embodiment, the covering sheet 12 and the hauling sheet 13 serve as a mask, and the covering portion 25 is not formed on a region of the valid portion YA facing the covering sheet 12 and the hauling sheet 13.

Main Effect

As illustrated in FIG. 11 and the like, the valid portion YA extends across the plurality of active regions and includes the vapor deposition holes formed to be arranged. Then, the valid portion YA has a shape corresponding to a shape of the active region 3, and includes the first region YA1 provided for each active region 3, and the second region YA2 defining the shape of the first region YA1 and provided with the covering portion 25 configured to cover the vapor deposition holes H.

Hence, at the vapor deposition step, the first region YA1 can be used to pattern and form the vapor-deposition layer for each pixel present in the active region 3 having a desired external shape.

For example, the first region YA1 having a shape defined by the covering portion 25 has a shape including curved portions 25a to 25d each having a rounded shape (round shape) corresponding to a shape of each of the four corners 43a to 43d of the active region 3 (see FIG. 3), and a notch 25e having an arc shape corresponding to a shape of the notch portion 43e.

The notch 25e is a notch in which the second region YA2 protrudes from one side of the first region YA1 toward the interior direction of this first region YA1. The curved portions 25a to 25d define the round shapes of four corners of the first region YA1. The vapor deposition holes in the first region YA1 surrounded by the curved portion 25a, the notch 25e, the curved portion 25b, the curved portion 25c, and the curved portion 25d are not covered with the covering portion 25, and are through-holes. On the other hand, the vapor deposition holes outside the first region YA1 in the curved portion 25a, the notch 25e, the curved portion 25b, the curved portion 25c, and the curved portion 25d are covered with the covering portion 25.

Accordingly, owing to the first region YA1 having the irregular-shape portion, the vapor-deposition layer can be formed for each pixel of the active region having the same external shape as the shape of the first region YA1, namely, having the irregular-shape portion.

Note that the shape of the first region YA1 is not limited to this, and the first region YA1 may have any shape as long as the first region YA1 has the same shape as the shape of the active region 3 (FIG. 3).

Figure 18:
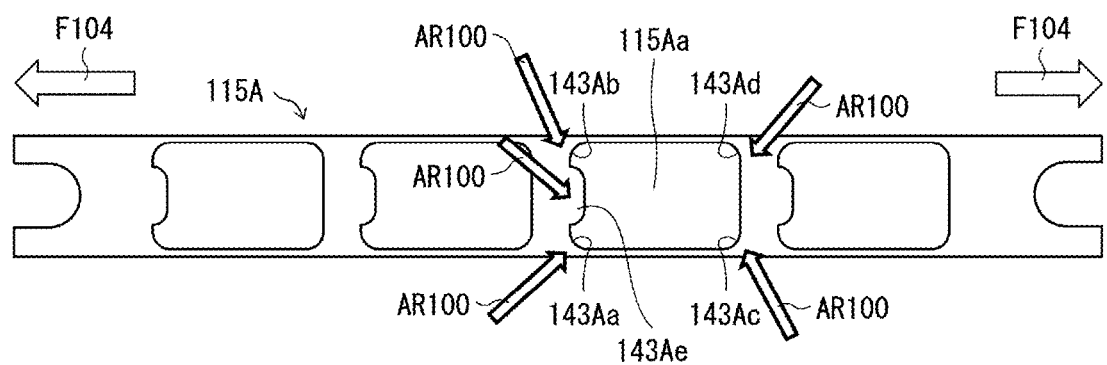
FIG. 18 is a plan view illustrating a configuration of a mask sheet according to a comparative example in which an external shape of a valid portion has an irregular shape.

FIG. 18 is a plan view illustrating a configuration of a mask sheet according to a comparative example in which an external shape of a valid portion has an irregular shape.

As illustrated in FIG. 18, a method in which an external shape of a valid portion has an irregular shape corresponding to a shape of an active region to pattern and form a vapor-deposition layer on the active region having an irregular shape by vapor deposition is conceivable.

In a mask sheet 115, valid portions 115Aa each having an irregular shape different from a square or rectangular shape are formed to be arranged in a mask sheet 115A.

Vapor deposition holes being through-holes are patterned and formed on the valid portions 115Aa. Each of the valid portions 115Aa includes four corners 143Aa to 143Ad each having a curved shape, rather than a right-angle shape. Further, a notched portion 143Ae recessed is formed on a portion of a straight side connecting the corner 143Aa and the corner 143Ab of the valid portion 115Aa.

When outward force is applied on both end portions of the mask sheet 115A as indicated by arrow F104 in FIG. 18 at the time of attachment of the mask sheet 115A including the valid portion 115Aa having such an irregular shape and formed to a mask frame, stress applied on regions in the periphery of the four corners 143Aa to 143Ad indicated by arrow AR100 and on regions in the periphery of the irregular-shape portion such as a region in the periphery of the notch portion 143Ae indicated by arrow AR101 becomes nonuniform, and thereby, an amount of deformation becomes nonuniform. As a result, positional accuracy of the vapor deposition holes in a vapor deposition mask to which the mask sheet 115A is attached deteriorates.

Figure 19:
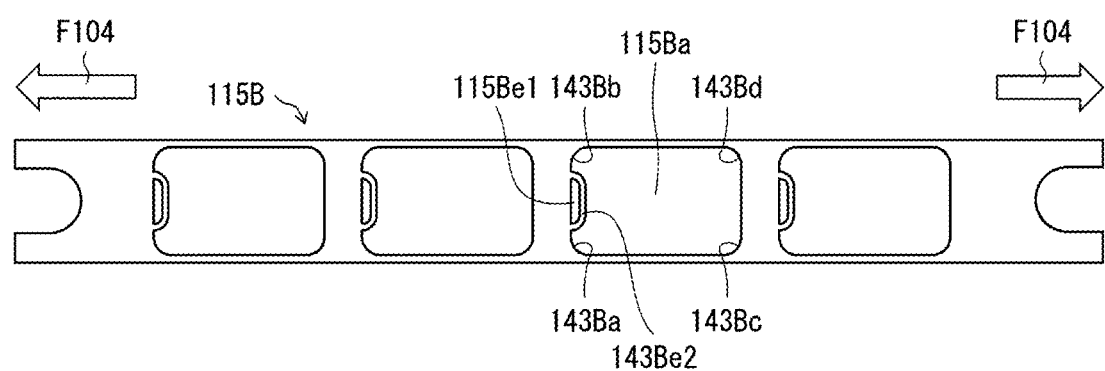
FIG. 19 is a plan view illustrating a configuration of a modification example of the mask sheet according to the comparative example in which the external shape of the valid portion has an irregular shape.

FIG. 19 is a plan view illustrating a configuration of a modification example of a mask sheet in which an external shape of a valid portion has an irregular shape.

In a valid portion 115Ba of a mask sheet 115B illustrated in FIG. 19, four corners 143Ba to 143Bd are curved. However, a method in which a full etching portion 143Be1 and a half etching portion 143Be2 are formed in a region corresponding to the notched portion 143Ae (see FIG. 18) is conceivable. Vapor deposition holes present in the full etching portion 143Be1 are through-holes, and recessed portions not penetrating are formed in a vapor-deposition-hole forming region present in the half etching portion 143Be2.

Accordingly, when outward force is applied on both end portions of the mask sheet 115B as indicated by arrow F104 in FIG. 19 at the time of attachment of the mask sheet 115B to the mask frame, nonuniformity of stress applied on regions in the periphery of the full etching portion 143Be1 and the half etching portion 143Be2 can be reduced to be lower than nonuniformity of stress applied on regions in the periphery of the notch portion 143Ae illustrated in FIG. 18. However, the stress applied on the regions in the periphery of the full etching portion 143Be1 and the half etching portion 143Be2 is still nonuniform, and further, nonuniformity of stress applied on the periphery of the four corners 143Ba to 143Bd still also remains.

On the other hand, in the vapor deposition mask 10 according to this embodiment, the valid portion YA of the mask sheet 15 has a rectangular or square shape as described above. Then, the covering portion 25 is provided on the valid portion YA, and thereby, the first region YA1 has the external shape corresponding to a shape of the irregular-shape portion of the active region 3.

Accordingly, the external shape of the valid portion YA particularly required of high positional accuracy on the vapor deposition mask 10 does not need to correspond to the external shape of the active region 3 on which the light-emitting layer is to be vapor-deposited. Hence, even when the external shape of the active region on which the vapor-deposition layer is to be vapor-deposited is an irregular shape, the external shape of the valid portion YA of the mask sheet 15 can be a rectangular or square shape (rectangular shape in this embodiment), rather than the irregular shape.

Hence, unlike the case where the valid portion has an irregular shape, even when the mask sheet 15 is stretched at the time of attachment of the mask sheet 15 to the mask frame 11, nonuniform stress can be prevented from being applied on the mask sheet 15. Accordingly, a vapor deposition mask 10 having high positional accuracy for vapor deposition holes H in the vapor deposition mask 10 can be obtained. Namely, a light-emitting layer can be vapor-deposited with the vapor deposition mask 10 on each pixel of a TFT substrate 2 with high accuracy.

Note that the external shape of the active region 3 present in the TFT substrate 2 and including the light-emitting layer formed can be set to have an irregular shape different from a square or rectangular shape, and an organic EL display panel with a high design property can be obtained.

In addition, in this embodiment, the mask sheet 15 is stretched and is welded to the mask frame 11 (at step Sd in FIG. 7 and in FIG. 8E), and then, the covering portion 25 is formed in the valid portion YA (at step Sf in FIG. 7 and in FIG. 8F). Namely, in this embodiment, the application step and the curing step are performed after the mask-sheet attachment step. Accordingly, Ta decrease in mask accuracy due to nonuniform stress caused by stretching of the mask sheet 15 after the covering portion 25 is formed can be prevented, and breaking of the covering portion 25 due to stretching of the mask sheet 15 can be prevented.

Figure 20:
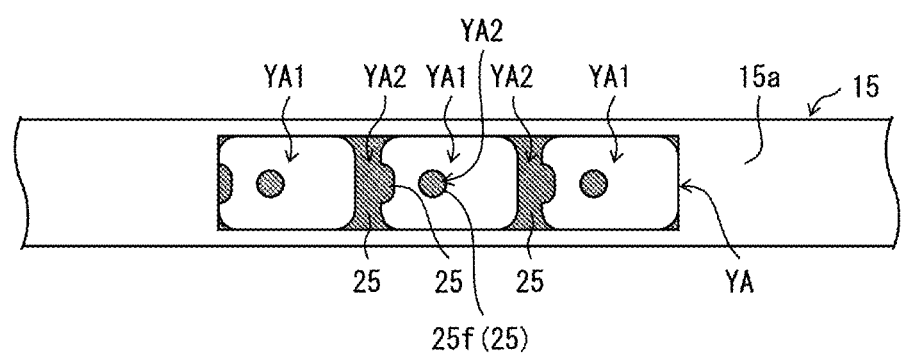
FIG. 20 is a view illustrating a configuration of a mask sheet according to the first embodiment in which a floating island portion is provided.

In addition, the covering portion 25 can be formed by application using an ink-jet method or the like, and hence, may be used not only to define the external shape of the irregular shape but also may be used to define a floating-island shape by providing a floating island portion 25f by using the covering portion 25 as illustrated in FIG. 20. The floating island portion 25f is a region surrounded by the first region YA1 and is a region different from the first region YA1. In other words, the floating island portion 25f is an isolated region located in the first region YA1 without being in contact with the external shape of the first region YA1, and in the isolated region, a plurality of vapor deposition holes are covered. Owing to this floating island portion 25f, a floating island portion having the same shape as a shape of the floating island portion 25f can also be provided at the same position as a position of the floating island portion 25f in the active region 3. The floating island portion provided in the active region 3 refers to a region surrounded by the active region 3 and different from the active region 3. In other words, the floating island portion in the active region 3 is an isolated region located in the active region 3 without being in contact with the external shape of the active region 3, and in the isolated region, no vapor-deposition layer is formed.

Thus, even when the floating island is provided within the active region 3, a floating island in the active region 3 can be formed by providing the floating island portion 25f in the valid portion YA.

Thus, according to the vapor deposition mask 10, a positional offset on the vapor deposition mask 10 of the vapor deposition holes H formed in the valid portion YA can be suppressed even when the external shape of the active region 3 has an irregular shape different from a rectangular or square shape.

Additionally, the external shape of the valid portion YA does not need to be changed even when the external shape of the active region 3 is changed. Hence, commonality of the mask sheet 15 including the valid portion YA formed can be achieved between substrates having various external shapes.

First Modification Example

Figure 13A:
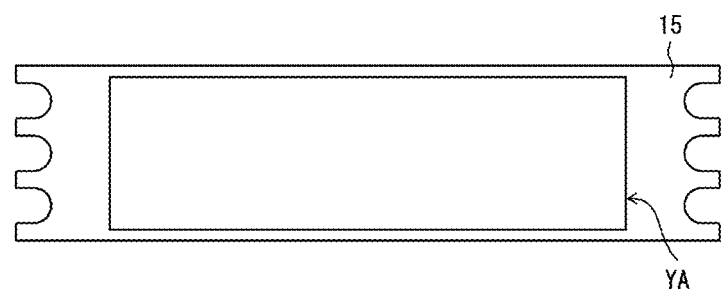
FIGS. 13A and 13B are views each illustrating a configuration of a vapor deposition mask according to a first modification example of the first embodiment.
Figure 13B:
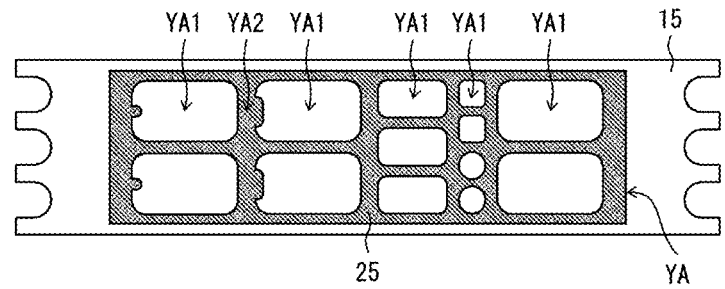

FIGS. 13A and 13B are views each illustrating a configuration of a vapor deposition mask 10 according to a first modification example of the first embodiment, FIG. 13A is a view illustrating a configuration of a wide mask sheet, and FIG. 13B is a view illustrating first regions YA1 having various shapes and provided in the mask sheet illustrated in FIG. 13A. Here, a direction in which a covering sheet 12 attached to a mask frame 11 extends is referred to as a transverse direction, and a direction in which a hauling sheet 13 attached to the mask frame 11 extends is referred to as a column direction (see FIGS. 8A to 8F).

As illustrated in FIG. 13A, a width (length in the column direction) of a valid portion YA of a mask sheet 15 may be large to the extent that a plurality of openings at which covering sheets 12 and hauling sheets 13 intersect each other overlap in the column direction.

In addition, as illustrated in FIG. 13B, one valid portion YA may be provided with first regions YA1a having a plurality of types of different shapes. Since a covering portion 25 is formed by application, and the covering portion 25 having a different shape can be provided in the valid portion YA. In the example illustrated in FIG. 13B, the number of the first regions YA1 provided in the column direction also varies in one valid portion YA.

However, active regions are also disposed on a TFT substrate at an interval of valid portions YA1 of an integral multiple of a pixel pitch.

Thus, a plurality of the first regions YA1 having different shapes may be provided on one common mask sheet 15. Accordingly, there is no need of preparing the mask sheet 15 for each of the active regions having different shapes.

Note that in addition, since the external shape of the valid portion YA is a square or rectangular shape, even when the mask sheet 15 is stretched, it is possible to attach the mask sheet 15 to the mask frame 11 without decrease in positional accuracy of vapor deposition holes.

Second Modification Example

Figure 14:
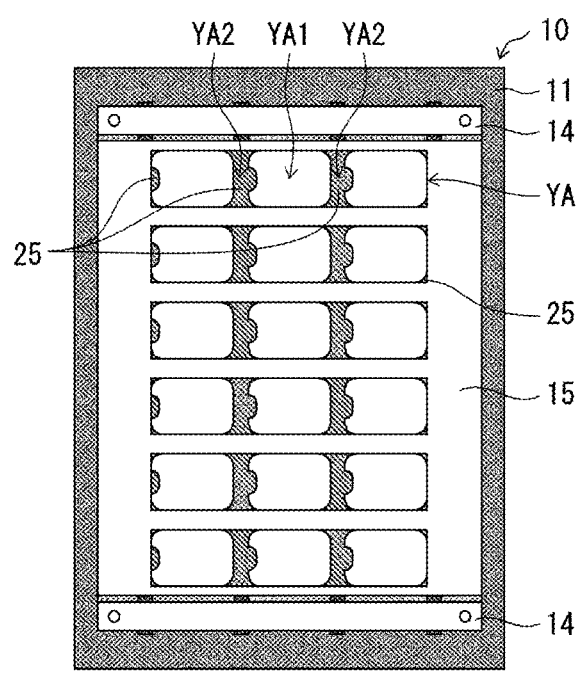
FIG. 14 is a view illustrating a configuration of a vapor deposition mask according to a second modification example of the first embodiment.

FIG. 14 is a view illustrating a configuration of a vapor deposition mask 10 according to a second modification example of the first embodiment. As illustrated in FIG. 14, one large mask sheet 15 may be attached to a mask frame 11, rather than a plurality of the mask sheets 15 attached to the mask frame 11.

In an example illustrated in FIG. 14, the one mask sheet 15 provided with a valid portion YA having area to the extent that the valid portion YA covers all openings at which covering sheets 12 and hauling sheets 13 intersect is attached to the mask frame 11. Subsequently, a light blocking material is applied to the valid portion YA by an inkjet device or the like, and is cured to form a covering portion 25. Accordingly, the first region YA can be provided for each of the openings at which the covering sheets 12 and the hauling sheets 13 intersect.

Second Embodiment

A covering portion 25 may be applied to a valid portion YA prior to stretching and welding of a mask sheet 15, and after the mask sheet 15 is stretched and welded, the covering portion 25 may be completely cured.

Figure 15:
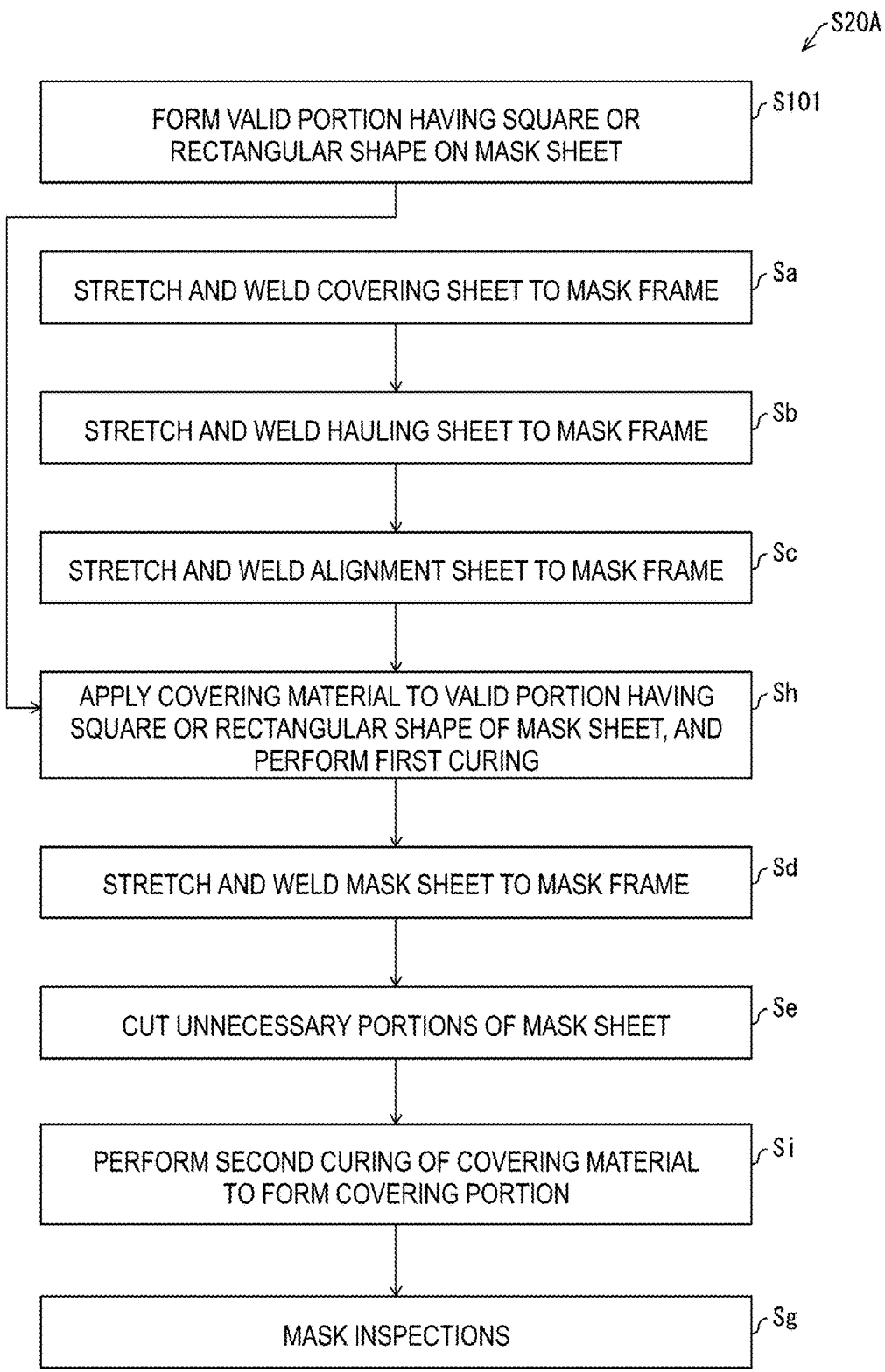
FIG. 15 is a view illustrating a vapor deposition step for a light-emitting layer of an organic EL display panel according to a second embodiment.
Figure 16A:
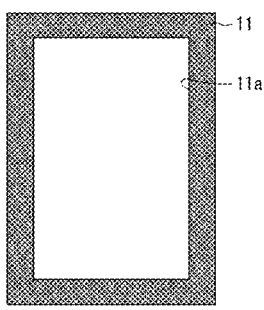
FIGS. 16A to 16F are views each illustrating a state where a vapor deposition mask according to the second embodiment is made.
Figure 16B:
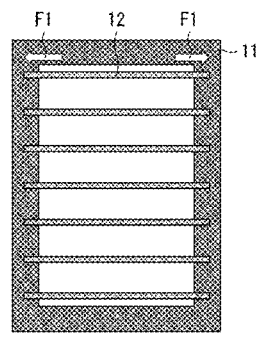
Figure 16C:
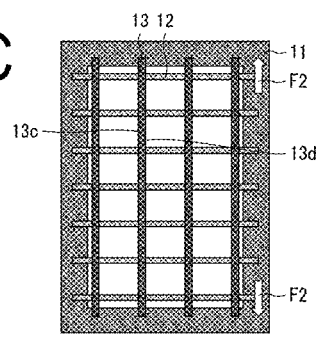
Figure 16D:
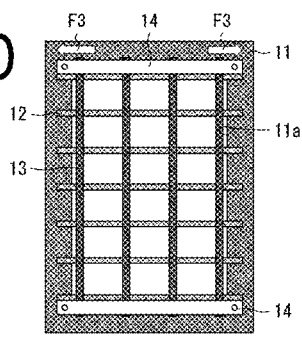
Figure 16E:
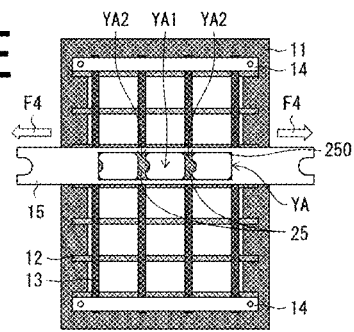
Figure 16F:
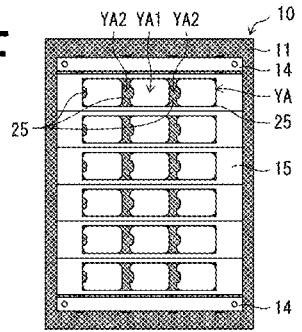
Figure 17A:
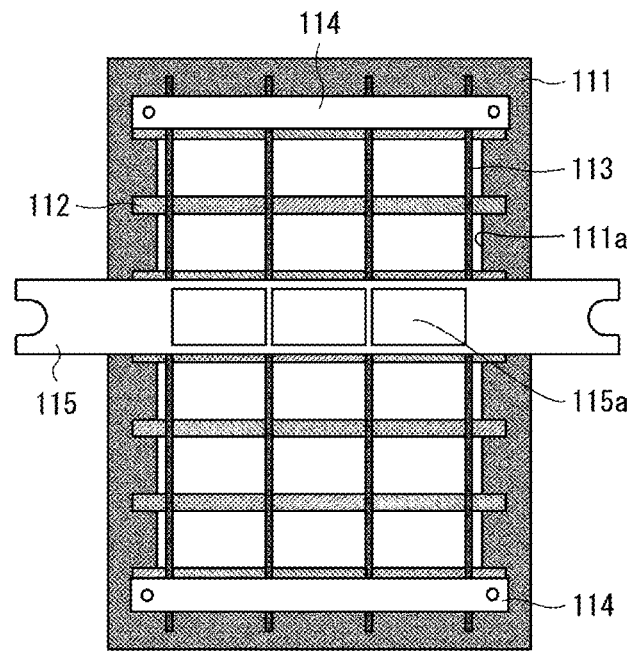
FIGS. 17A and 17B are views each illustrating a state where a vapor deposition mask of the related art is made.
Figure 17B:
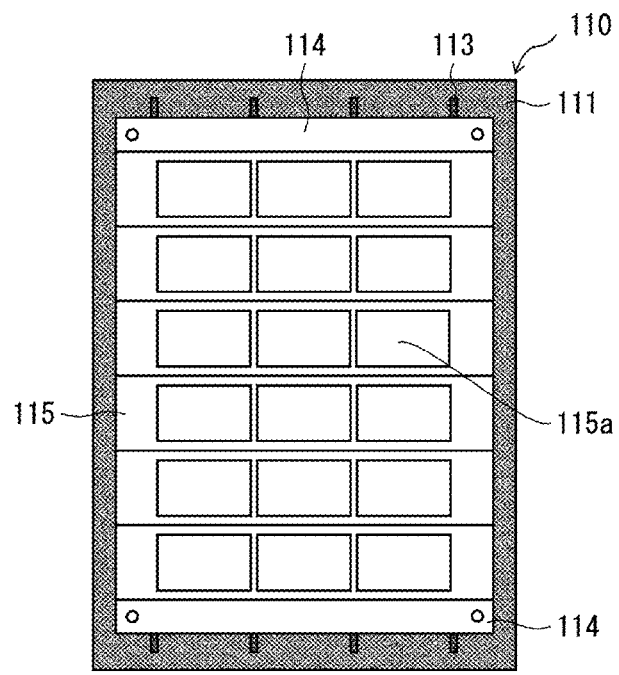

FIG. 15 is a view illustrating a vapor deposition step for a light-emitting layer of an organic EL display panel according to the second embodiment. FIGS. 16A to 16F are views each illustrating a state where a vapor deposition mask according to the second embodiment is made. FIG. 16A is a plan view illustrating a mask frame. FIG. 16B is a view illustrating a state where a covering sheet is attached to the mask frame. FIG. 16C is a view illustrating a state where a hauling sheet is attached to the mask frame. FIG. 16D is a view illustrating a state where an alignment sheet is attached to the mask frame. FIG. 16E is a view illustrating a state where a mask sheet is attached to the mask frame. FIG. 16F is a plan view illustrating a vapor deposition mask made.

In this embodiment, step S20A illustrated in FIG. 15 is performed instead of step S20 illustrated in FIG. 7.

Steps Sa to Sc illustrated in FIG. 15 and FIGS. 16A to 16D are the same as steps Sa to Sc illustrated in FIG. 7 and FIGS. 8A to 8D.

As illustrated at step Sc in FIG. 15 and illustrated in FIG. 16D, an alignment sheet 14 is attached to a mask frame 11 to make an alignment mark located at a predetermined position.

Next, as illustrated at step Sh in FIG. 15 and illustrated in FIG. 16E, a covering material 250 (FIG. 10A) for covering vapor deposition holes is applied to the outside of a shape corresponding to a shape of an active region 3 (see FIG. 3) in a plurality of the valid portions YA of the mask sheet 15 where the valid portions YA are formed in advance at the valid-portion forming step (application step). Then, the covering material 250 applied is preliminarily cured (first curing, preliminary curing) to the extent that the covering material 250 is not completely cured (first curing step).

At the first curing step, in a case where a thermosetting resin is used for the covering material 250, the covering material 250 is heated at a low temperature or for short heating time to the extent that the covering portion 25 completely cured is not formed. In addition, in a case where a photocurable resin is used for the covering material 250, the covering material 250 is irradiated with light such as ultraviolet light at a low light level or for short irradiation time to the extent that the covering portion 25 completely cured is not formed. In addition, at the first curing step, in a case where any of a thermosetting resin or a photocurable resin is used for the covering material 250, the covering material 250 may be cured preliminarily at a reduced pressure.

Then, as illustrated at step Sd in FIG. 15 and illustrated in FIG. 16E, a plurality of the mask sheets 15 are attached to the mask frame 11 (mask-sheet attachment step).

At step Sd, at the time of attachment of the mask sheet 15 to the mask frame 11, both end portions of the mask sheet 15 are accurately welded at predetermined positions of the mask frame 11 to make the vapor deposition holes constituting the valid portions YA located at predetermined positions by using the alignment mark formed on the alignment sheet 14 as a reference while both the end portions of the mask sheet 15 are stretched (pulled) by application of force to each of both the end portions of the mask sheet 15 in an outward direction (in a direction away from each other) as indicated by arrow F4 in FIG. 16E.

Here, the covering material 250 preliminarily cured is provided on the valid portions YA of the mask sheet 15. However, since the covering material 250 is not completely cured, the covering material 250 follows the extension of the mask sheet 15 and extends even when the mask sheet 15 is stretched and extends. Hence, a fault due to the stretch of the mask sheet 15 can be prevented from occurring in the covering material 250.

Then, after all the necessary sheets of the mask sheets 15 are attached to the mask frame 11 to cause all the openings defined by the covering sheets 12 and the hauling sheets 13 to be covered with the valid portions YA as illustrated in FIG. 16F, unnecessary portions of the mask sheets 15 located outside of the welded portions are cut off as illustrated at step Se in FIG. 15 and illustrated in FIG. 16F.

Then, as illustrated at step Si in FIG. 15 and illustrated in FIG. 16F, the covering material 250 preliminarily cured are caused to be completely cured (second curing) (second curing step). Accordingly, the covering portion 25 is formed in the valid portions YA (covering-portion forming step).

At the second curing step, in a case where a thermosetting resin is used for the covering material 250, the covering material 250 is heated at a high temperature or for sufficient heating time to the extent that the covering material 250 is completely cured. In addition, in a case where a photocurable resin is used for the covering material 250, the covering material 250 is irradiated with light such as ultraviolet light at a high light level or for a sufficient irradiation time to the extent that the covering material 250 is completely cured.

Accordingly, a vapor deposition mask 10 is complete.

Next, as illustrated at step Sg in FIG. 15, the vapor deposition mask 10 complete is cleaned, and various mask inspections such as inspection for foreign matters and inspection for accuracy are performed. Subsequently, vapor deposition masks 10 having no problem found in the mask inspections are stored in a stocker, and are supplied to a vapor deposition apparatus used at the vapor deposition step as needed.

Note that the order of step Se and step Si may be reversed, and the covering portion may be formed in the valid portions YA of the mask sheet 15 (step Si) and then, the unnecessary portions of the mask sheet 15 may be cut (step Se).

Thus, in the second embodiment, the curing step includes the first curing step for preliminarily curing the covering material 250, and the second curing step for further curing the covering material 250 preliminarily cured to form the covering portion 25. Then, the application step and the first curing step are performed before the mask-sheet attachment step, and the second curing step is performed after the mask-sheet attachment step. Accordingly, the covering portion 25 can also be provided with sufficiently high positional accuracy to define the shape of a first region YA1 in the valid portion YA.

Note that, at the application step, the covering material 250 may be applied to a second region YA2 in a state where both the end portions of the mask sheet 15 are stretched by application of force to each of both the end portions in an outward direction (in a direction away from each other). Accordingly, a fault due to the stretch of the mask sheet 15 can be prevented more reliably from occurring in the covering portion 25.

In addition, in this embodiment, the mask sheet 15 is attached to the mask frame 11 after the covering material 250 to be the covering portion 25 is applied, and hence, the covering portion 25 is not layered on the hauling sheet 13 between the valid portions YA.

In addition, the display according to the first and second embodiments is not particularly limited, as long as the display is a display panel including a display element. The display element is a display element of which luminance and transmittance are controlled by an electric current, and examples of an electric current-controlled display element include an organic Electro Luminescence (EL) display including an Organic Light Emitting Diode (OLED), an EL display such as an inorganic EL display including an inorganic light emitting diode, or a QLED display including a Quantum Dot Light Emitting Diode (QLED).

Supplement

A vapor deposition mask according to a first aspect provides a vapor deposition mask configured to be used to vapor-deposit a vapor-deposition layer on each of pixels of a vapor target substrate provided with a plurality of active regions on which the pixels contributing to displaying are arranged, the vapor deposition mask including: a mask sheet including a valid portion extending across the plurality of active regions and including a plurality of vapor deposition holes formed to be arranged, wherein the valid portion includes a first region and a second region, the first region has a shape corresponding to a shape of each of the active regions, and the second region is provided with a covering portion configured to define a shape of the first region and cover a portion of a vapor deposition hole of the plurality of vapor deposition holes.

In the vapor deposition mask according to a second aspect, the covering portion may be provided to extend across the plurality of vapor deposition holes present in the second region.

In the vapor deposition mask according to a third aspect, the covering portion may be provided on a second surface of the mask sheet located on the opposite side to a first surface facing the vapor target substrate.

In the vapor deposition mask according to a fourth aspect, the covering portion may be made of a resin.

In the vapor deposition mask according to a fifth aspect, the covering portion may be made of a photocurable resin.

In the vapor deposition mask according to a sixth aspect, the valid portion may have a square or rectangular shape.

In the vapor deposition mask according to a seventh aspect, the valid portion may be provided with a plurality of the first regions having different shapes.

A method for manufacturing a vapor deposition mask according to an eighth aspect provides a method for manufacturing a vapor deposition mask used to vapor-deposit a vapor-deposition layer on each of pixels of a vapor target substrate provided with a plurality of active regions on which the pixels contributing to displaying are arranged, the method including: a vapor-deposition-hole forming step for forming vapor deposition holes in a mask sheet to provide a valid portion extending across the plurality of active regions; and a covering-portion forming step for forming, outside of a shape of the valid portion corresponding to each of the active regions in the valid portion, a covering portion configured to cover the vapor deposition holes, to provide, for each of the active regions, a first region having a shape corresponding to a shape of each of the active regions and provide a second region provided with the covering portion.

In the method for manufacturing a vapor deposition mask according to a ninth aspect, the covering-portion forming step may include an application step for applying a covering material to a region being to be the second region located in the mask sheet, and a curing step for curing the covering material applied at the application step to form the covering portion.

In a method for manufacturing a vapor deposition mask according to a tenth aspect provides a method for manufacturing a vapor deposition mask used to vapor-deposit a vapor-deposition layer on each of pixels of a vapor target substrate provided with a plurality of active regions on which the pixels contributing to displaying are arranged, the method including: a vapor-deposition-hole forming step for forming a plurality of vapor deposition holes in a mask sheet to provide a valid portion extending across a plurality of the active regions; and a covering-portion forming step for forming, outside of a shape of the valid portion corresponding to each of the active regions in the valid portion, a covering portion configured to cover a portion of a vapor deposition hole of the plurality of vapor deposition holes, to provide, for each of the active regions, a first region having a shape corresponding to a shape of each of the active regions and provide a second region provided with the covering portion.

In the method for manufacturing a vapor deposition mask according to an eleventh aspect, the method may include a mask-sheet attachment step for attaching the mask sheet to a mask frame having a frame shape while the mask sheet is stretched, wherein the curing step may include: a first curing step for preliminarily curing the covering material; and a second curing step for further curing the preliminarily cured covering material to form the covering portion, and the application step and the first curing step may be performed before the mask-sheet attachment step, and the second curing step may be performed after the mask-sheet attachment step.

The disclosure is not limited to each of the embodiments described above, and various modifications can be implemented within the scope of the claims. Embodiments obtained by appropriately combining the technical approaches disclosed in each of the different embodiments also fall within the technical scope of the disclosure. Further, novel technical features can be formed by combining the technical approaches disclosed in each of the embodiments.

REFERENCE SIGNS LIST

1 Substrate
2 TFT substrate (vapor target substrate)
3 Active region
4 Frame-shaped bank
5 Sealing layer
6, 8 Inorganic film
7 Organic film
9 Organic EL display panel formation region
10 Vapor deposition mask
11 Mask frame
12 Covering sheet
13 Hauling sheet
14 Alignment sheet
15 Mask sheet
15a Sheet portion
25 Covering portion
25a Curved portion
30 Electronic device
40 Touch panel
41 Touch sensor
42 Organic EL display panel
43 Display region
44 Frame region
50 Inkjet device
70 Vapor deposition source
80 Light-emitting layer
H Vapor deposition hole
pix pixel
YA2 Second region of valid portion YA
YA1 First region of valid portion YA

The invention claimed is:

1. A vapor deposition mask configured to be used to vapor-deposit a vapor-deposition layer on each of pixels of a vapor target substrate provided with a plurality of active regions on which the pixels contributing to displaying are arranged, the vapor deposition mask comprising:
a mask sheet provided with a valid portion extending across the plurality of active regions and including a plurality of vapor deposition holes formed to be arranged, wherein
the valid portion includes a first region and a second region,
the first region has a shape corresponding to a shape of each of the active regions,
the second region is provided with a covering portion configured to define a shape of the first region and cover a portion of a vapor deposition hole of the plurality of vapor deposition holes,
the covering portion is made of a resin, the first region includes a notch in which the second region protrudes from one side of the first region toward an interior direction, and the plurality of vapor deposition holes in a region located outside of the first region and surrounded by the notch are covered with the covering portion.

2. A vapor deposition mask configured to be used to vapor-deposit a vapor-deposition layer on each of pixels of a vapor target substrate provided with a plurality of active regions on which the pixels contributing to displaying are arranged, the vapor deposition mask comprising:

a mask sheet provided with a valid portion extending across the plurality of active regions and including a plurality of vapor deposition holes formed to be arranged, wherein the valid portion includes a first region and a second region, the first region has a shape corresponding to a shape of each of the active regions, the second region is provided with a covering portion configured to define a shape of the first region and cover a portion of a vapor deposition hole of the plurality of vapor deposition holes, the covering portion is made of a resin, and the second region includes a floating island portion being a region surrounded by the first region, and being not in contact with an external shape of the first region.

3. A method for manufacturing the vapor deposition mask according to claim 1, the method comprising:

a vapor-deposition-hole forming step for forming the plurality of vapor deposition holes in the mask sheet to provide the valid portion extending across the plurality of active regions; and a covering-portion forming step for forming, outside of a shape of the valid portion corresponding to the shape of each of the active regions in the valid portion, the covering portion configured to cover the portion of a vapor deposition hole of the plurality of vapor deposition holes, to provide, for each of the active regions, the first region corresponding to the shape of each of the active regions and provide the second region provided with the covering portion, wherein the covering-portion forming step includes an application step for applying a covering material to a region being to be the second region located in the mask sheet, and a curing step for curing the covering material applied at the application step to form the covering portion.

4. The method for manufacturing a vapor deposition mask according to claim 3, comprising:

a mask-sheet attachment step for attaching the mask sheet to a mask frame having a frame shape while the mask sheet is stretched, wherein the application step and the curing step are performed after the mask-sheet attachment step.

5. The method for manufacturing a vapor deposition mask according to claim 4, comprising:

a mask-sheet attachment step for attaching the mask sheet to a mask frame having a frame shape while the mask sheet is stretched, wherein the curing step includes a first curing step for preliminarily curing the covering material, and a second curing step for further curing the preliminarily cured covering material to form the covering portion, the application step and the first curing step are performed before the mask-sheet attachment step, after the first curing step, the mask sheet is attached to the mask frame at the mask-sheet attachment step while the mask sheet is stretched, and the second curing step is performed after the mask-sheet attachment step.

6. The method of manufacturing a vapor deposition mask according to claim 3, wherein the valid portion has a square or rectangular shape.

7. A vapor deposition mask configured to be used to vapor-deposit a vapor-deposition layer on each of pixels of a vapor target substrate provided with a plurality of active regions on which the pixels contributing to displaying are arranged, the vapor deposition mask comprising:

a mask sheet provided with a valid portion extending across the plurality of active regions and including a plurality of vapor deposition holes formed to be arranged, wherein the valid portion includes a first region and a second region, the first region has a shape corresponding to a shape of each of the active regions, the second region is provided with a covering portion configured to define a shape of the first region and cover a portion of a vapor deposition hole of the plurality of vapor deposition holes, and the second region includes a floating island portion being a region surrounded by the first region, and being not in contact with an external shape of the first region.

8. The vapor deposition mask according to claim 7, wherein the covering portion is provided to extend across the plurality of vapor deposition holes present in the second region.

9. The vapor deposition mask according to claim 7, wherein the covering portion is provided on a second surface of the mask sheet located on an opposite side to a first surface facing the vapor target substrate.

10. The vapor deposition mask according to claim 7, wherein the valid portion has a square or rectangular shape.

11. The vapor deposition mask according to claim 7, wherein the valid portion is provided with a plurality of the first regions having different shapes.

12. The vapor deposition mask according to claim 7, wherein the first region includes a notch in which the second region protrudes from one side of the first region toward an interior direction, and the plurality of vapor deposition holes in a region located outside of the first region and surrounded by the notch are covered with the covering portion.

* * * * *